(12) United States Patent
Cho et al.

(10) Patent No.: US 11,922,984 B2
(45) Date of Patent: Mar. 5, 2024

(54) MEMORY DEVICE HAVING VOLATILE AND NON-VOLATILE MEMORY CELLS

(71) Applicant: SAMSUNG ELECTRONICS CO., LTD., Suwon-si (KR)

(72) Inventors: Minhee Cho, Suwon-si (KR); Woobin Song, Hwaseong-si (KR); Hyunmog Park, Seoul (KR); Sangkil Lee, Seongnam-si (KR)

(73) Assignee: Samsung Electronics Co., Ltd. (KR)

(\*) Notice: Subject to any disclaimer, the term of this patent is extended or adjusted under 35 U.S.C. 154(b) by 0 days.

(21) Appl. No.: 17/949,305

(22) Filed: Sep. 21, 2022

(65) Prior Publication Data

US 2023/0021071 A1  Jan. 19, 2023

Related U.S. Application Data

(60) Continuation of application No. 17/330,828, filed on May 26, 2021, now Pat. No. 11,482,267, which is a
(Continued)

(30) Foreign Application Priority Data

Jun. 4, 2019 (KR) .................. 10-2019-0065763

(51) Int. Cl.
    *G11C 16/04* (2006.01)
    *G11C 11/00* (2006.01)
    (Continued)

(52) U.S. Cl.
    CPC .......... *G11C 11/005* (2013.01); *G11C 11/223* (2013.01); *G11C 11/2275* (2013.01);
    (Continued)

(58) Field of Classification Search
    CPC .................................................. G11C 11/005
    (Continued)

(56) References Cited

U.S. PATENT DOCUMENTS 6,259,126 B1   7/2001   Hsu et al.
8,901,704 B2   12/2014  Kang
(Continued)

FOREIGN PATENT DOCUMENTS

KR   10-2006-0095161 A   8/2006

OTHER PUBLICATIONS

T.S. Böscke et al., "Ferroelectricity in hafnium oxide thin films", Applied Physics Letters, 2011, 99, pp. 1-3.
(Continued)

*Primary Examiner* — Hoai V Ho
(74) *Attorney, Agent, or Firm* — Fish & Richardson P.C.

(57) ABSTRACT

A memory device includes a substrate including first and second regions, the first region having first wordlines and first bitlines, and the second region having second wordlines and second bitlines, a first memory cell array including first memory cells in the first region, the first memory cell array having volatility, and each of the first memory cells including a cell switch having a first channel region adjacent to a corresponding first wordline of the first wordlines, and a capacitor connected to the cell switch, and a second memory cell array including second memory cells in the second region, the second memory cell array having non-volatility, and each of the second memory cells including a second channel region adjacent to a corresponding second wordline of the second wordlines, and a ferroelectric layer between the corresponding second wordline of the second wordlines and the second channel region.

10 Claims, 21 Drawing Sheets

Related U.S. Application Data division of application No. 16/704,320, filed on Dec. 5, 2019, now Pat. No. 11,062,751.

(51) Int. Cl.
  *G11C 11/22* (2006.01)
  *G11C 11/4096* (2006.01)
  *H10B 12/00* (2023.01)
  *H10B 51/30* (2023.01)
  *H10B 51/40* (2023.01)

(52) U.S. Cl.
  CPC .......... *G11C 11/4096* (2013.01); *H10B 12/33* (2023.02); *H10B 12/50* (2023.02); *H10B 51/30* (2023.02); *H10B 51/40* (2023.02)

(58) Field of Classification Search
  USPC .................................. 365/145, 149, 185.08
  See application file for complete search history.

(56) References Cited

U.S. PATENT DOCUMENTS

| | | |
|---|---|---|
| 9,991,171 B1 | 6/2018 | Zhou |
| 10,056,463 B2 | 8/2018 | Xing et al. |
| 10,170,486 B2 | 1/2019 | Atsumi et al. |
| 2018/0059958 A1* | 3/2018 | Ryan .................... G11C 11/4096 |
| 2018/0158526 A1 | 6/2018 | Kim et al. |
| 2018/0286987 A1 | 10/2018 | Lee et al. |
| 2019/0325919 A1* | 10/2019 | Bhargava ............... G11C 5/025 |
| 2019/0362791 A1 | 11/2019 | Kim et al. |

OTHER PUBLICATIONS

B. Oh et al., "Enhancing DRAM Self-Refresh for Idle Power Reduction", University of Michigan, 2016.
M Trentzsch et al., "A 28nm HKMG super low power embedded NVM technology based on ferroelectric FETs", 2016, IEEE.
S.J. Kim et al., "Large ferroelectric polarization of TiN/$Hf_{0.5}Zr_{0.5}O_2$/TiN capacitors due to stressinduced crystallization at low thermal budget", Applied Physics Letters, 2017, 111, pp. 1-5.
F. Mo et al., "Experimental Demonstration of Ferroelectric $HfO_2$ FET with Ultrathin-body IGZO for High-Density and Low-Power Memory Application", 2019, Symposium on VLSI Tecnology Digest of Technical Papers.
"System Sleeping States", Microsoft Power System Doc (www.MS.com).

* cited by examiner

MEMORY DEVICE HAVING VOLATILE AND NON-VOLATILE MEMORY CELLS

CROSS-REFERENCE TO RELATED APPLICATION

This is a continuation of U.S. patent application Ser. No. 17/330,828 filed May 26, 2021, which is a division of U.S. patent application Ser. No. 16/704,320 filed Dec. 5, 2019, now U.S. Pat. No. 11,062,751, which issued Jul. 13, 2021, each which is incorporated by reference herein in its entirety.

Korean Patent Application No. 10-2019-0065763, filed on Jun. 4, 2019, in the Korean Intellectual Property Office, and entitled: "Memory Device," is incorporated by reference herein in its entirety.

BACKGROUND

1. Field

The present disclosure relates to a memory device.

2. Description of the Related Art

A memory device includes a plurality of memory chips, which may store and output data, and may have volatility or non-volatility. A dynamic memory device is used as a main memory of a computer device due to high operating speed thereof, but needs to periodically perform a refresh operation to prevent data loss caused by volatility thereof. The refresh operation of the dynamic memory device may take up a considerable part of power consumed by the dynamic memory device. When a nonvolatile memory device is employed as a main memory, it may be difficult to secure the same operating speed as the dynamic memory.

SUMMARY

According to an example embodiment, a memory device includes a substrate having a first region, having first wordlines and first bitlines, and a second region having second wordlines and second bitlines, a first memory cell array including first memory cells, disposed in the first region and having volatility, the first memory cells each including a cell switch having a first channel region adjacent to the first wordline and a capacitor connected to the cell switch, and a second memory cell array including second memory cells, disposed in the second region and having non-volatility, the second memory cells each including a second channel region adjacent to the second wordline and a ferroelectric layer disposed between the second wordline and the second channel region.

According to an example embodiment, a memory device includes a plurality of first memory cells, each of the plurality of first memory cells including a first gate structure embedded in a substrate, a first active region, disposed adjacent to the first gate structure and providing a first channel region, a first gate insulating layer disposed between the first gate structure and the first channel region, and a capacitor connected to the first active region and extended in a direction perpendicular to a top surface of the substrate, a plurality of second memory cells, each of the plurality of second memory cells including a second gate structure, a second active region, disposed adjacent to the second gate structure and providing a second channel region, and a second gate insulating layer, disposed between the second gate structure and the second channel region and including a ferroelectric material having a higher dielectric constant than the first area insulating layer, the plurality of second memory cells storing or erasing data based on a polarization state of the second gate insulating layer, and a plurality of transfer switches, each including active regions connected to the first gate structure and the second gate structure.

According to an example embodiment, a memory device includes a first memory cell array having memory cells having volatility, a second memory cell array including second memory cells having non-volatility, the second memory cell having a size smaller than a size of the first memory cell, transfer switches disposed between the first memory cells and the second memory cells, and a controller configured to turn on the plurality of transfer switches and read data of at least one of the first memory cells and store the data in at least one of the second memory cells.

According to an example embodiment, a method of manufacturing a memory device includes forming isolation layers in a first region and a second region of a substrate to define first active regions, disposed in the first region, and second active regions disposed in the second region, removing at least a portion of the first active regions and at least a portion of the second active regions to form trenches, forming first gate insulating layers in the trenches of the first active regions, forming second gate insulating layers of a material, different from a material of the first gate insulating layers, in the trenches of the second active regions, and forming gate structures in the trenches.

According to an example embodiment, a method of manufacturing a memory device includes forming a first gate structure embedded in a substrate, a first active region providing a first channel region adjacent to the first gate structure, and a capacitor connected to the first active region and extended in a direction perpendicular to a top surface of the substrate, forming an interlayer insulating layer to cover the capacitor, forming a second gate structure on the interlayer insulating layer, forming a ferroelectric layer to cover the second gate structure, and forming a second channel region, including an indium-gallium-zinc oxide, and a second active region, connected to the second channel region, on the ferroelectric layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
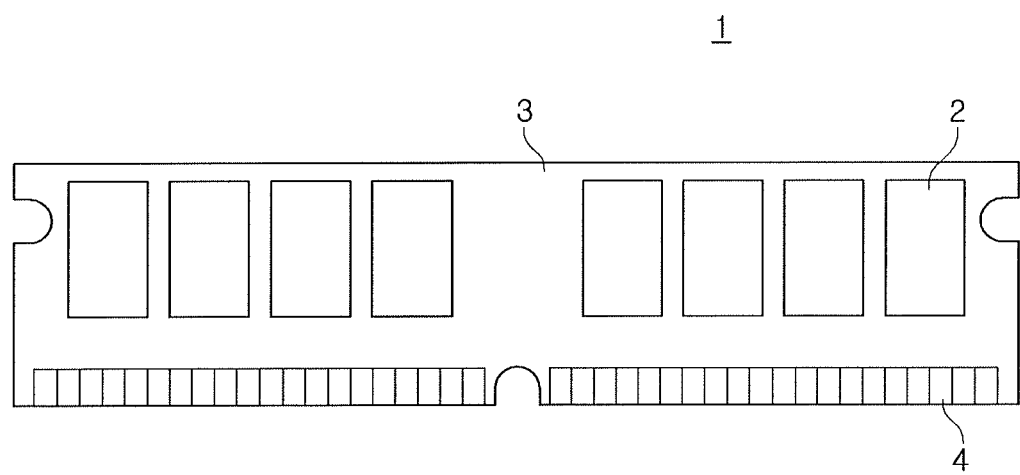
FIGS. 1 and 2 illustrate a memory device according to an example embodiment.
Figure 2:
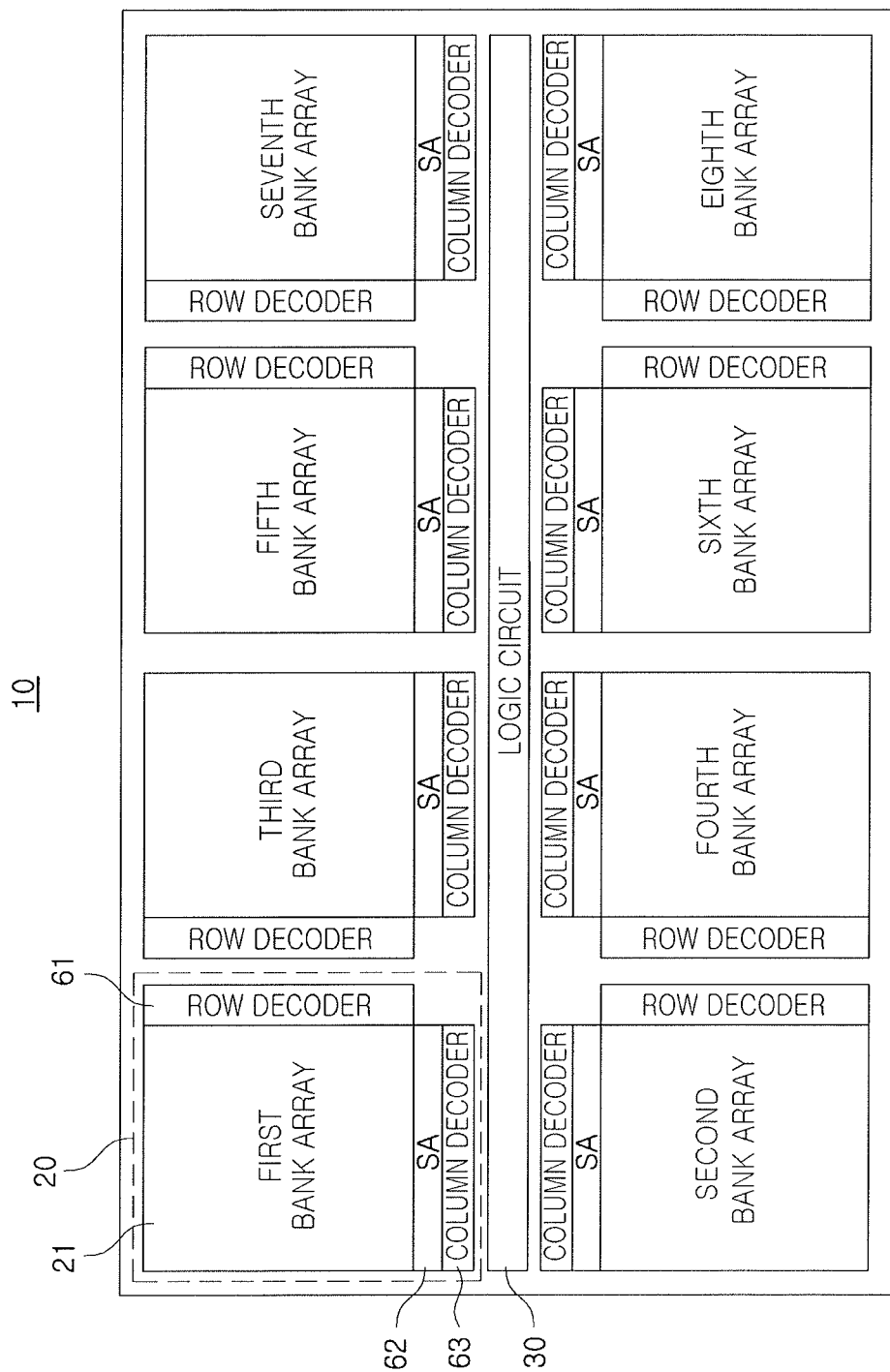

FIGS. 1 and 2 illustrate a memory device according to an example embodiment. In particular, FIG. 1 illustrates a schematic view of a memory module with a plurality of memory chips, while FIG. 2 illustrates a detailed schematic view of a plurality of memory chips.

Referring to FIG. 1, a memory module 1 according to an example embodiment may include a plurality of memory chips 2 on a substrate 3. One end of the substrate 3 may be provided with input/output (I/O) pins 4 for transmitting and receiving data. The plurality of memory chips 2 may receive and store data through the I/O pins 4, or may output data through the I/O pins 4. In FIG. 1, a single memory module 1 is illustrated as including eight memory chips 2. However, the number of the memory chips 2 may vary depending on data storage capacity to be provided by the memory module 1 and data storage capacity of each of the memory chips 2, or the like.

The substrate 3 may be provided with an input/output (I/O) bus connecting the memory chips 2 and the I/O pins 4 to each other, and the memory chips 2 may share the I/O bus. The I/O pins 4 may be connected to data input/output (DQ) paths of the plurality of memory chips 2, respectively.

Referring to FIG. 2, a memory device 10 according to an example embodiment may include a memory bank 20 and a logic circuit 30. For example, as illustrated in FIG. 2, a plurality of memory banks 20 may be arranged adjacent to each other. The memory banks 20 of FIG. 2 are detailed schematic representations of the memory chips 2 of FIG. 1, e.g., the memory bank 20 and the memory chip 2 may be used hereinafter interchangeably.

As illustrated in FIG. 2, the memory bank 20 may include a bank array 21 including a plurality of memory cells, a row decoder 61, a sense amplifier 62, a column decoder 63, and the like. In an example embodiment, the memory device 10 may include a plurality of memory banks 20.

The plurality of memory banks 20, included in the memory device 10, may share a single logic circuit 30. The logic circuit 30 may read data from the memory banks 20 or may write data into the memory banks 20. In addition, the logic circuit 30 may assign an address in which data is to be stored, or may determine an operating mode of the memory device 10. In addition, the logic circuit 30 may include an input/output (I/O) pad for transmitting data to be stored in the plurality of memory banks 20 and data output by the plurality of memory banks 20.

The bank array 21 may include a memory cell array including a plurality of memory cells. In an example embodiment, the memory cell array may include a first memory cell array, including first memory cells having volatility, and a second memory cell array including second memory cells having non-volatility. The memory device 10 may use the first memory cell array as main storage of data, and may store data of the first memory cell array in the second memory cell array, as necessary. High operating speed may be secured using the memory cell array as a main storage. In addition, a refresh operation of preventing data loss of the first memory cells may be significantly reduced using the second memory cell array to improve power consumption.

Figure 3:
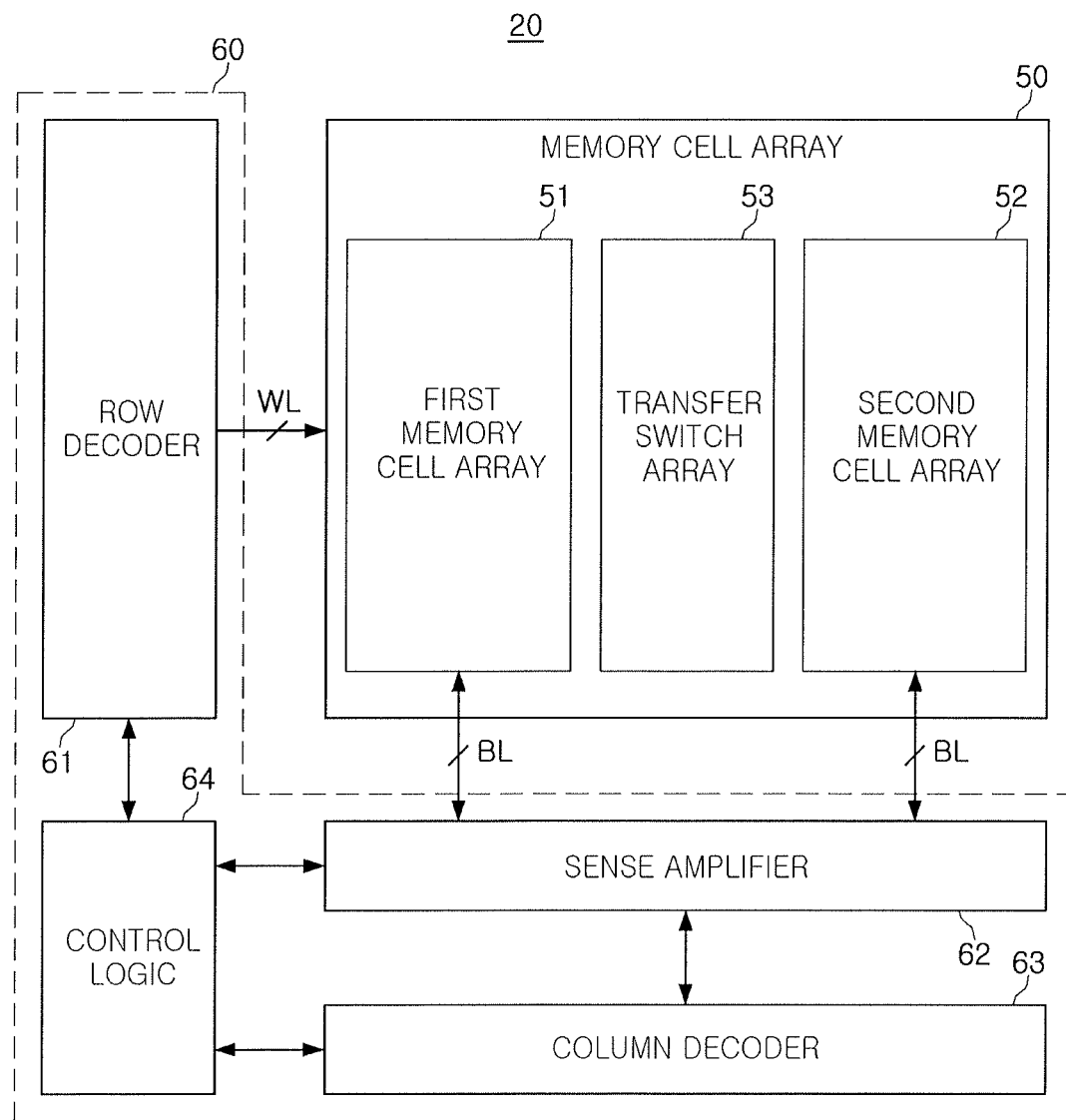
FIG. 3 illustrates a schematic block diagram of a memory chip according to an example embodiment.

FIG. 3 is a schematic detailed block diagram of the memory chip 2 (i.e., the memory bank 20) according to an example embodiment. FIG. 3 illustrates an internal structure of the memory bank 20 according to an example embodiment.

Referring to FIG. 3, the memory bank 20 according to an example embodiment may include a memory cell array 50 and a controller 60. The controller 60 may include the row decoder 61, the sense amplifier 62, the column decoder 63, a control logic 64, and the like. The memory cell array 50 may include a plurality of memory cells.

In an example embodiment, the row decoder 61 may be connected to the memory cells through a wordline WL, and the sense amplifier 62 may be connected to the memory cells through a bitline BL. In an example embodiment, the row decoder 61 may write data or may select a memory cell to read data, and the sense amplifier 62 may write data into a memory cell or may read data from a memory cell. The column decoder 63 may transmit data to be written to the sense amplifier 62 or may transmit data, read from the memory cell array 50, to the control logic 64. The control logic 64 may control operations of the row decoder 61, the sense amplifier 62, the column decoder 63, or the like.

Referring to FIG. 3, the memory cell array 50 may include a first memory cell array 51, a second memory cell array 52, a transfer switch array 53, and the like. The first memory cell array 51 may include first memory cells having volatility, and the second memory cell array 52 may include second memory cells having non-volatility. As an example, the first memory cells may be dynamic random access memory (DRAM) cells, and the second memory cells may be ferroelectric random access memory (FeRAM) cells.

The transfer switch array 53 may connect or disconnect the first memory cell array 51 and the second memory cell array 52 to or from each other. In the example embodiment illustrated in FIG. 3, the transfer switch array 53 is illustrated as being disposed between the first memory cell array 51 and the second memory cell array 52. However, a disposition of the transfer switch array 53 is not limited thereto. As an example, when the transfer switch array 53 is turned on, the first memory cell array 51 and the second memory cell array 52 may be connected to each other, and the controller 60 may store data of the first memory cell array 51 in the second memory cell array 52 or may store data of the second memory cell array 52 in the first memory cell array 51.

Figure 4:
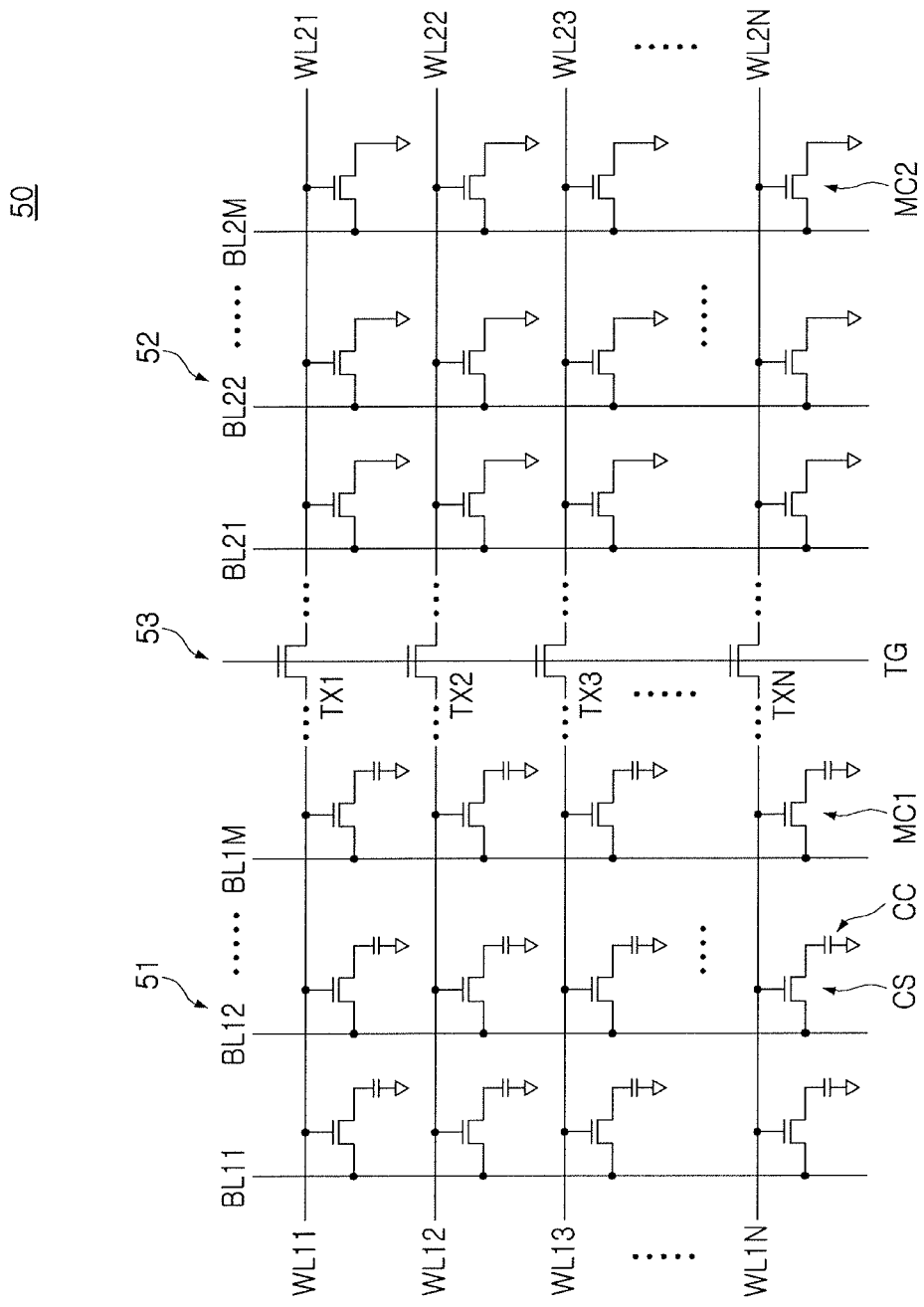
FIG. 4 illustrates a memory cell array of a memory device according to an example embodiment.

FIG. 4 illustrates an electrical diagram of the memory cell array 50 of a memory device according to an example embodiment.

Referring to FIG. 4, the memory cell array 50 of a memory device according to an example embodiment may include the first memory cell array 51, the second memory cell array 52, the transfer switch array 53, and the like. The first memory cell array 51 may include first memory cells MC1, and the first memory cells MC1 may be connected to first wordlines WL11 to WL1N and first bitlines BL11 to BL1M. The second memory cell array 52 may include second memory cells MC2, and the second memory cell MC2 may be connected to second wordlines WL21 to WL2N and second bitlines BL21 to BL2M.

Each of the first memory cells MC1 may include a cell switch CS and a cell capacitor CC. When the cell switch CS is turned on by a control voltage input to the first wordlines WL11 to WL1N, the cell capacitor CC may be charged or discharged by a voltage, input to the first bitlines BL11 to BL1M, to write or erase data. In the first memory cell array 51, a refresh operation may be performed to prevent data loss caused by leakage current of the cell capacitor CC.

Each of the second memory cells MC2 may be implemented with a cell component including a ferroelectric layer. A cell component may include a ferroelectric layer disposed between a channel region and a gate. A polarization state of the ferroelectric layer may be changed by a voltage input to the gate of the cell component through the second wordlines WL21 to WL2N, and a threshold voltage of each of the second memory cells MC2 may vary depending on the polarization state of the ferroelectric layer. For example, data may be written into the second memory cells MC2 or data of the second memory cells MC2 may be erased, by adjusting the polarization state of the ferroelectric layer. The second memory cells MC2 may be implemented with only one cell component without a capacitor. Thus, each of the second memory cells MC2 may have a smaller size than each of the first memory cells MC1 including the cell capacitor CC.

The transfer switch array 53 may include a plurality of transfer switches TX1 to TXN. Gates of the plurality of transfer switches TX1 to TXN may be connected to each other. Accordingly, the transfer switches TX1 to TXN may be simultaneously turned on or off. The first wordlines WL11 to WL1N and the second wordlines WL21 to WL2N may be connected or disconnected by the transfer switches TX1 to TXN.

When the transfer switches TX1 to TXN are turned off, the first wordlines WL11 to WL1N and the second wordlines WL21 to WL2N may be disconnected from each other. In the state in which the transfer switches TX1 to TXN are turned off, data may be stored in the first memory cells MC1 or data may be read from the first memory cells MC1. For example, the second memory cell array 80 may be deactivated while the transfer switches TX1 to TXN are turned off.

When the transfer switches TX1 to TXN are turned on, the first wordlines WL11 to WL1N and the second wordlines WL21 to WL2N may be connected to each other. Thus, at least one of the second wordlines WL21 to WL2N may be selected together by a signal for selecting at least one of the first wordlines WL11 to WL1N. The transfer switches TX1 to TXN may be turned on and data, read from the first memory cells MC1 through the first bitlines BL11 to BL1M, may be stored in the second memory cells MC through the second bitlines BL21 to BL2M. Alternatively, data, read from the second memory cells MC2, may be stored in the first memory cells MC1.

As an example, storage capacitor of the first memory cells may be equal to storage capacitor of the second memory cells MC2. In this case, the number of the first memory cells MC1 may be equal to the number of the second memory cells MC2. Alternatively, the storage capacity of the second memory cells MC2 may be higher than the storage capacity of the first memory cells MC1. When the capacity of the second memory cells MC2 is lower than the storage capacity of the first memory cells MC1, only data of some memory cells, in which data is actually stored, among the first memory cells MC1, may be transferred to the second memory cells MC1 and stored therein.

In an example embodiment, data may be retained without a refresh operation of the first memory cells by turning on the transfer switches TX1 to TXN and storing data of the first memory cells MC1 in the second memory cells MC2 having non-volatility. Thus, power consumed by the refresh operation may be significantly reduced. An operation of storing data of the first memory cells MC1 in the second memory cells MC2 may be performed in every predetermined period, or may be performed in an idle state in which data on the first memory cells MC1 is not changed.

In the idle state, power consumed in the refresh operation of the first memory cells MC1 may occupy a significantly high proportion of the total consumed power of a memory device. In an example embodiment, data of the first memory cells MC1 may be backed up to the second memory MC2 to temporarily stop the refresh operation in the idle state. Thus, power consumption may be reduced. When out of the idle state, the transfer switches TX1 to TXN may be turned on again and data of the second memory cells MC1 may be read and then stored in the first memory cells MC.

Figure 5:
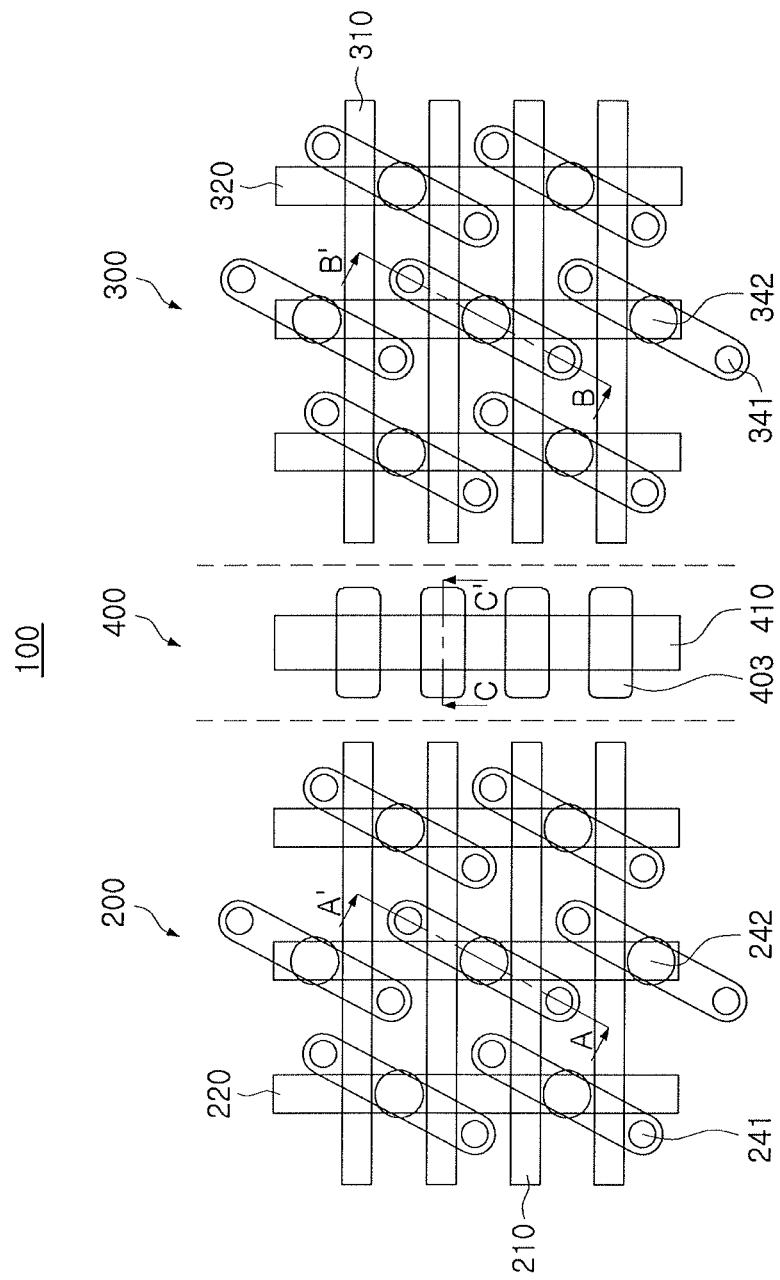
FIG. 5 illustrates a schematic top view of a memory cell array of a memory device according to an example embodiment.
Figure 6:
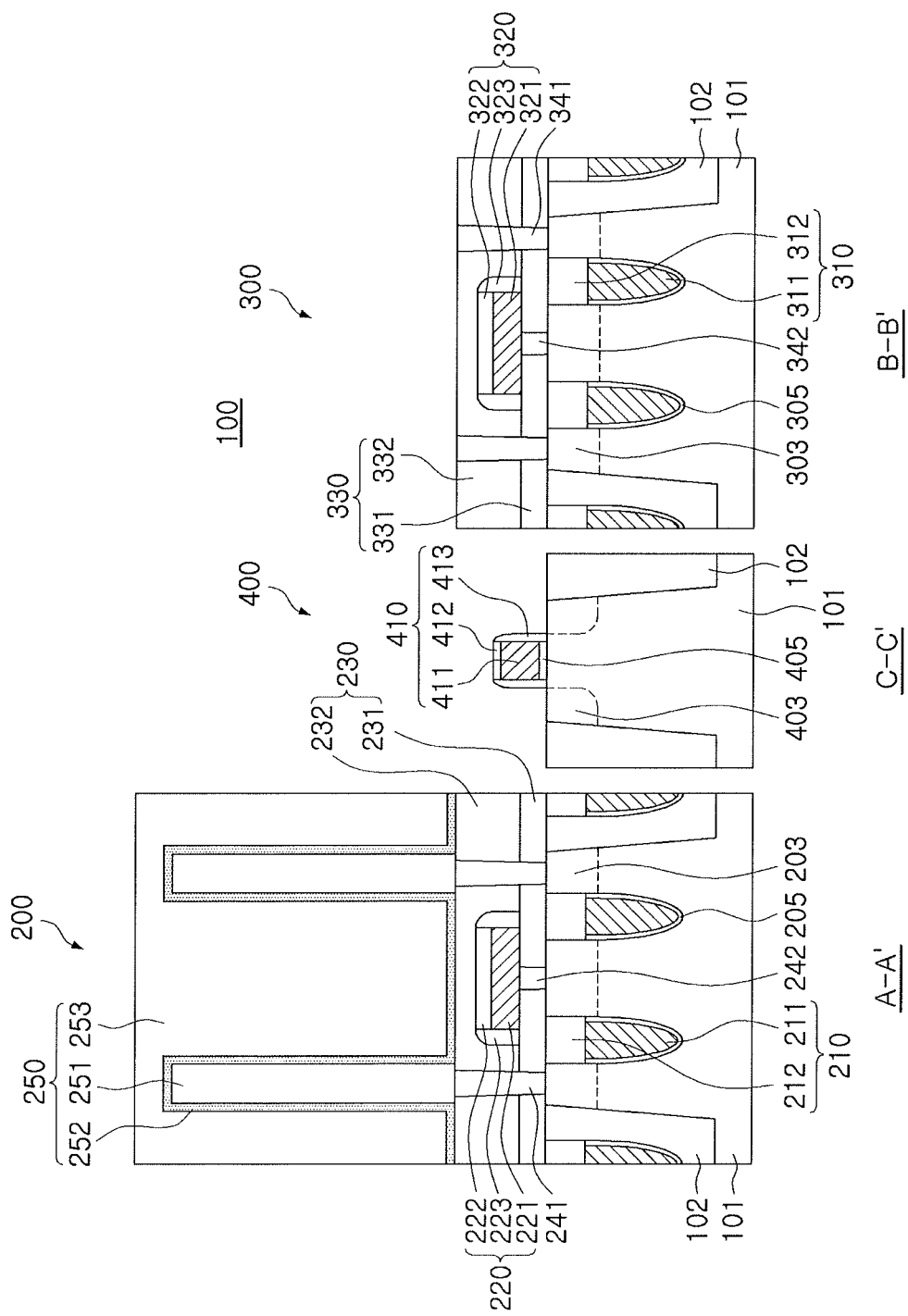
FIG. 6 illustrates a cross-sectional view taken along lines A-A', B-B', and C-C' of the memory cell array illustrated in FIG. 5.

FIG. 5 is a schematic top view of a memory cell array of a memory device according to an example embodiment, and FIG. 6 is a cross-sectional view taken along lines A-A', B-B', and C-C' of the memory cell array illustrated in FIG. 5.

Referring to FIGS. 5 and 6, a memory device 100 according to an example embodiment may include a substrate 101. The substrate 101 may include a first region 200, a second region 300, a third region 400, and the like. The first region 200 may correspond to a first memory cell array in which first memory cells are formed (e.g., the first memory cell array 51 of FIGS. 3-4), and the second region 300 may correspond to a second memory cell array in which second memory cells are formed (e.g., the second memory cell array 52 of FIGS. 3-4). The third region 400 may correspond to a transfer switch array in which transfer switches are formed (e.g., the transfer switch array 53 of FIGS. 3-4). The first memory cells, the second memory cells, and the transfer switches may be formed in regions, except for an isolation layer 102 formed in the substrate 101.

In the example embodiment illustrated in FIGS. 5 and 6, the third region 400 may be disposed between the first region 200 and the second region 300. However, a position of the third region 400, in which transfer switches are formed, may vary depending on example embodiments.

As illustrated in FIGS. 5-6, a first active region 203 defined between isolation layers 102, a first gate structure 210 providing a first wordline, a first bitline structure 220 connected to at least a portion of the first active region 203, a capacitor structure 250, and the like, may be formed in the first region 200. The first gate structure 210 may intersect the first active region 203 and the first bitline structure 220, and may be embedded in the substrate 101. The first wordline and bitline structure 220 in FIG. 6 correspond to an exemplary one of the first wordlines WL11 to WL1N and first bitlines BL11 to BL1M in FIG. 4.

The first gate structure 210 may include a first gate electrode layer 211, a first capping layer 212, and the like. The first gate electrode layer 211 may be formed of a conductive material, e.g., a metal or a metal compound, and the first capping layer 212 may be formed of an insulating material, e.g., silicon nitride. A first gate insulating layer 205 may be disposed between the first gate electrode layer 211 and the substrate 101, and may be formed of, e.g., a silicon oxide or the like.

The first active region 203 may be doped with impurities, and may provide a source region and a drain region of a cell switch included in the first memory cell. A first active region 203, disposed between the first gate structure 210 and the isolation layer 102, may be connected to the capacitor structure 250 through a first contact 241. A first active region 203, disposed between a pair of first gate structures 210 adjacent to each other, may be connected to the first bitline structure 220 through a second contact 242.

The first bitline structure 220 may be embedded in an intermediate insulating layer 230 together with the first contact 241 and the second contact 242. The intermediate insulating layer 230 may include a first intermediate insulating layer 231 and a second intermediate insulating layer 232. The first bitline structure 220 may include a first bitline conductive layer 221, a first bitline capping layer 222, a first spacer layer 223, and the like.

The capacitor structure 250 may be connected to the first active region 203 through the first contact 241, and may include a lower electrode layer 251, a dielectric layer 252, an upper electrode layer 253, and the like. The capacitor structure 250 may extend in a direction perpendicular to a top surface of the substrate 101. The lower electrode layer 251 may have a pillar shape, as illustrated in FIGS. 5 and 6, or a hollow cylinder shape.

A second active region 303 defined between the isolation layers 102, a second gate structure 310 providing a second wordline, a second bitline structure 320 connected to at least a portion of the second active region 303, and the like, may be formed in the second region 300. In the second region 300, second memory cells providing a second memory cell array may be implemented with only one cell component without a capacitor. Thus, the second memory cell may have a size smaller than a size of the first memory cell formed in the first region 200. As an example, the second memory cell may have a height less than a height of the first memory cell, e.g., along a direction normal to a top surface of the substrate 101. The second wordline and bitline structure 320 in FIG. 6 correspond to an exemplary one of the second wordlines WL21 to WL2N and second bitlines BL21 to BL2M in FIG. 4.

Similarly to the first region 200, in the second region 300, the second gate structure 310 may intersect the second active region 303 and the second bitline structure 320 and may be embedded in the substrate 101. As an example, the first active region 203 of the first region 200 and the second active region 303 of the second region 300 may be simultaneously formed. In addition, the first gate structure 210 of the first region 200 and the second gate structure 310 of the second region 300 may be simultaneously formed. The second gate structure 310 may include a second gate electrode layer 311, a second capping layer 312, and the like. The second gate electrode layer 311 and the second capping layer 312 may be formed of the same material as the first gate electrode layer 211 and the first capping layer 212, respectively.

A second gate insulating layer 305 may be formed between the second gate electrode layer 311 and the substrate 101. The second gate insulating layer 305 may be formed of a material different from a material of the first gate insulating layer 205. As an example, the second gate insulating layer 305 may be formed of hafnium silicon oxide (HfSiO$_x$), hafnium zirconium oxide (HfZrO$_x$), hafnium aluminum oxide (HfAlO$_x$), or the like. A polarization state of the second gate insulating layer 305 may be changed by a voltage input to the second gate structure 310, and voltage-current characteristics of the second memory cell may vary depending on the polarization state of the second gate insulating layer 305. Accordingly, data may be written into the second memory cell by adjusting the polarization state of the second gate insulating layer 305.

A portion of the second active region 303 may be connected to the first contact 341, and the other portion of the second active region 303 may be connected to the second contact 342. The second contact 342 may be connected to the second bitline structure 320. The second bitline structure 320 may have a structure similar to a structure of the first bitline structure 220. As an example, the second bitline structure 320 may include a second bitline conductive layer 321, a second bitline capping layer 322, and a second spacer layer 323.

The third region 400 may include a plurality of transfer switches formed between the isolation layers 102. The transfer switches may share one single transfer gate structure 410, and the transfer gate structure 410 may include a transfer gate electrode layer 411, a transfer gate capping layer 412, a spacer layer 413, and the like. A transfer gate insulating layer 405 may be formed between the transfer gate electrode layer 411 and the substrate 101, and may be formed of, e.g., a silicon oxide or the like.

Active regions 403, doped with impurities, may be formed on opposite sides adjacent to the transfer gate structure 410. In the example embodiment illustrated in FIGS. 5 and 6, the transfer switches are illustrated as having the transfer gate structure which is not embedded in the substrate 101, unlike cell switches of the first and second memory cells, but a configuration of the transfer switches is not limited thereto.

The transfer switches may connect or disconnect first wordlines of the first region 200 and second wordlines of the second region 300 to or from each other. As an example, in each of the transfer switches, the active regions 403 on opposite sides adjacent to the transfer gate structure 410 may be connected to the first gate structure 210 and the second gate structure 310, respectively. Accordingly, when the transfer switches are turned on by a voltage input to the transfer gate structure 410, the first gate structure 210 and the second gate structure 310 may be electrically connected to achieve the effect that the first wordlines and the second wordlines are connected to each other.

In another example, unlike the example embodiment illustrated in FIGS. 5 and 6, in the second region 300, the second gate structure 310 for providing the second memory cells may not be embedded in the substrate 101. For example, the second gate structure 310 may not be embedded in the substrate 101, unlike the first gate structure 210 of the first memory cells, and may be disposed on a top surface of the substrate 101, similarly to the transfer gate structure 410. In this case, the second gate structure 310 may be formed in a process performed separately from a process of the first gate structure 210.

FIGS. 7 to 13 illustrate stages in a method of manufacturing a memory device according to an example embodiment. FIGS. 7 to 13 correspond to cross sections taken along lines A-A', B-B', and C-C' of FIG. 5 during manufacturing of the memory device 100. As described above, the substrate 101 may include the first region 200 in which first memory cells are formed, the second region 300 in which second memory cells are formed, and the third region 400 in which transfer switches are formed.

Figure 7:
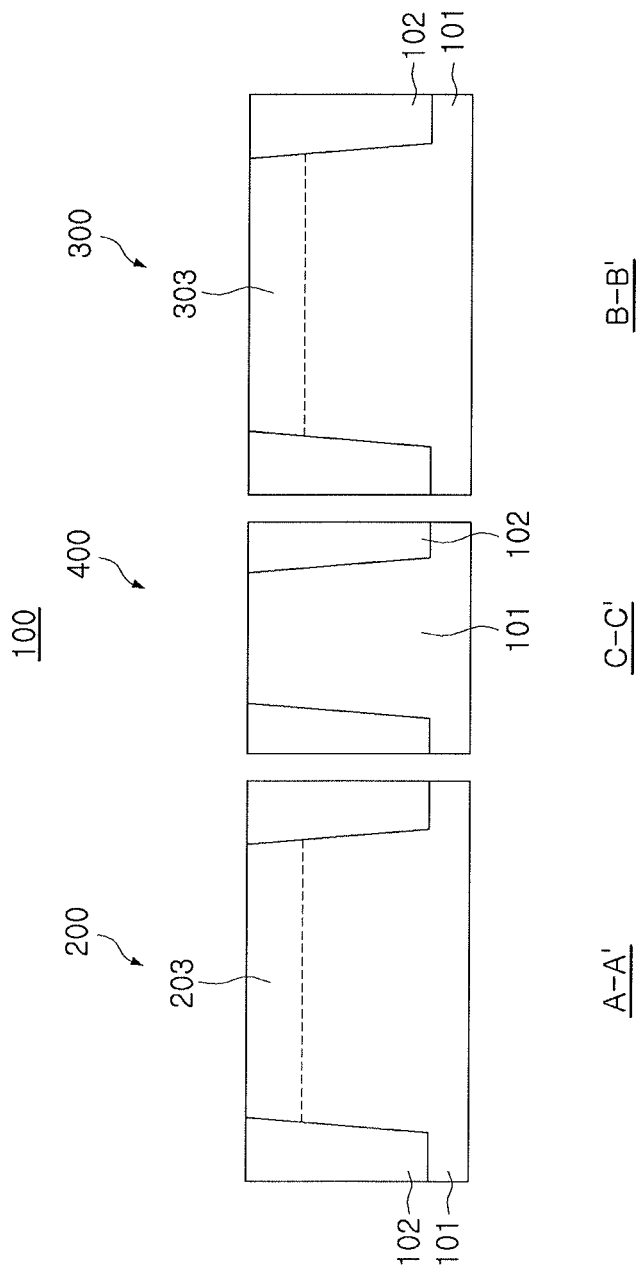
FIGS. 7 to 13 illustrate stages in a method of manufacturing a memory device according to an example embodiment.

Referring to FIG. 7, at least a portion of the substrate 101 may be removed by etching, and the removed portion may be filled with an insulating material to form the isolation layer 102. The isolation layer 102 may be formed on an entire surface of the substrate 101. As an example, the isolation layer 102 may be simultaneously formed in the first region 200, the second region 300, and the third region 400.

When the isolation layer 102 is formed, impurities may be implanted into the first region 200 and the second region 300 to form the first active region 203 and the second active region 303. The first active region 203 and the second active region 303 may be doped with impurities having the same conductivity type. In an example embodiment, the first active region 203 and the second active region 303 may be doped with N-type impurities.

Figure 8:
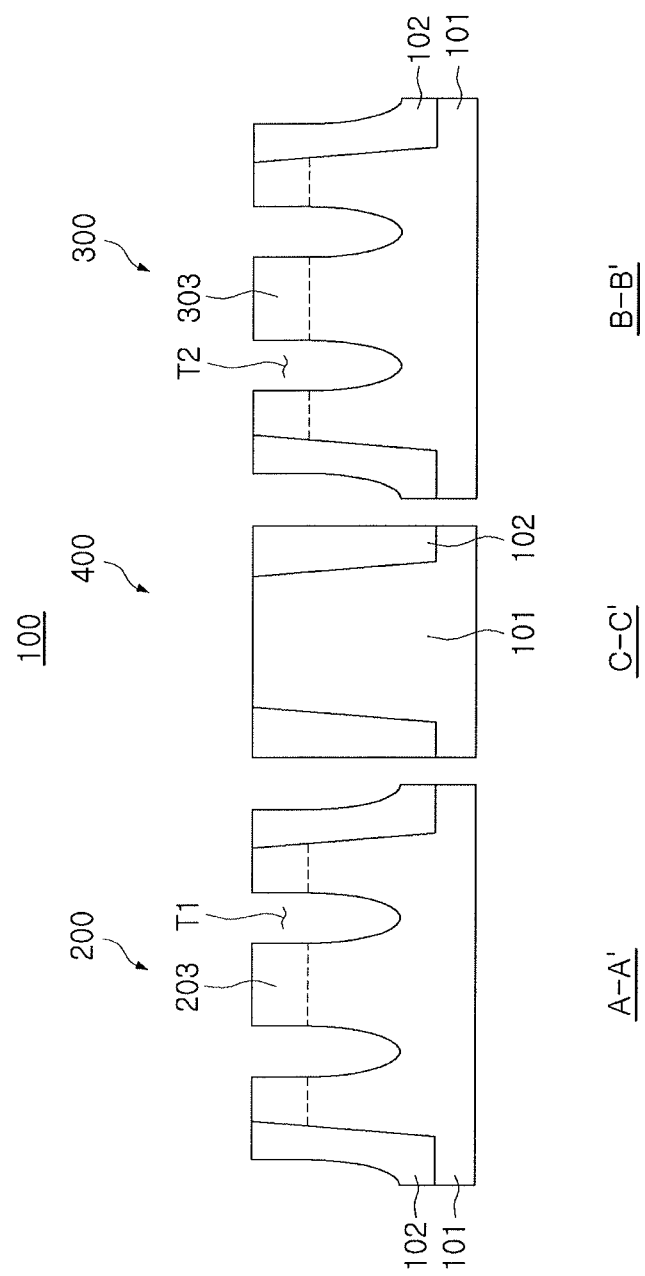

Referring to FIG. 8, at least a portion of the substrate 101 may be etched in the region, in which the first active region 203 and the second active region 303 are formed, to form first trenches T1 and second trenches T2. The first trenches T1 and the second trenches T2 may be simultaneously formed and extend in the same direction parallel to the top surface of the substrate 101. As illustrated in FIG. 8, a pair of first trenches T1 may be formed in one first active region 203, and a pair of second trenches T1 may be formed in one second active region 303.

Figure 9:
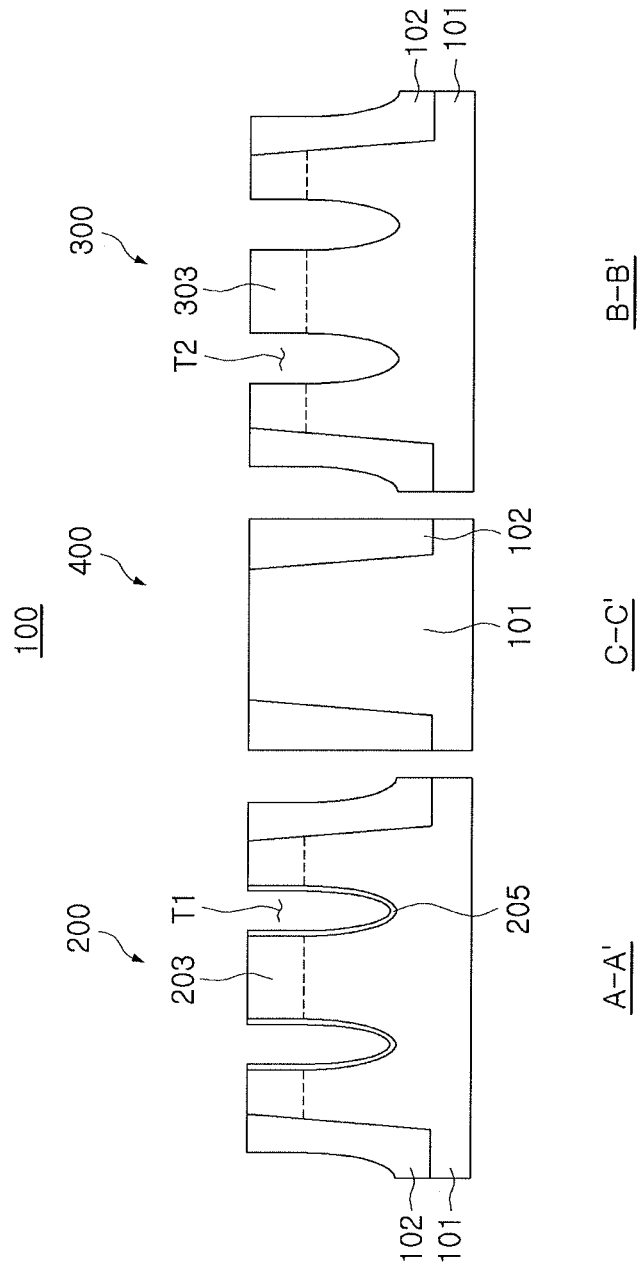

Referring to FIG. 9, the first gate insulating layer 205 may be formed in the first trenches T1. The first gate insulating layer 205 may be formed of an insulating material, e.g., silicon oxide. The second trenches T2 may be covered with a mask layer, or the like, during formation of the first gate insulating layer 205. Accordingly, the first gate insulating layer 205 may not be formed in the second trenches T2.

Figure 10:
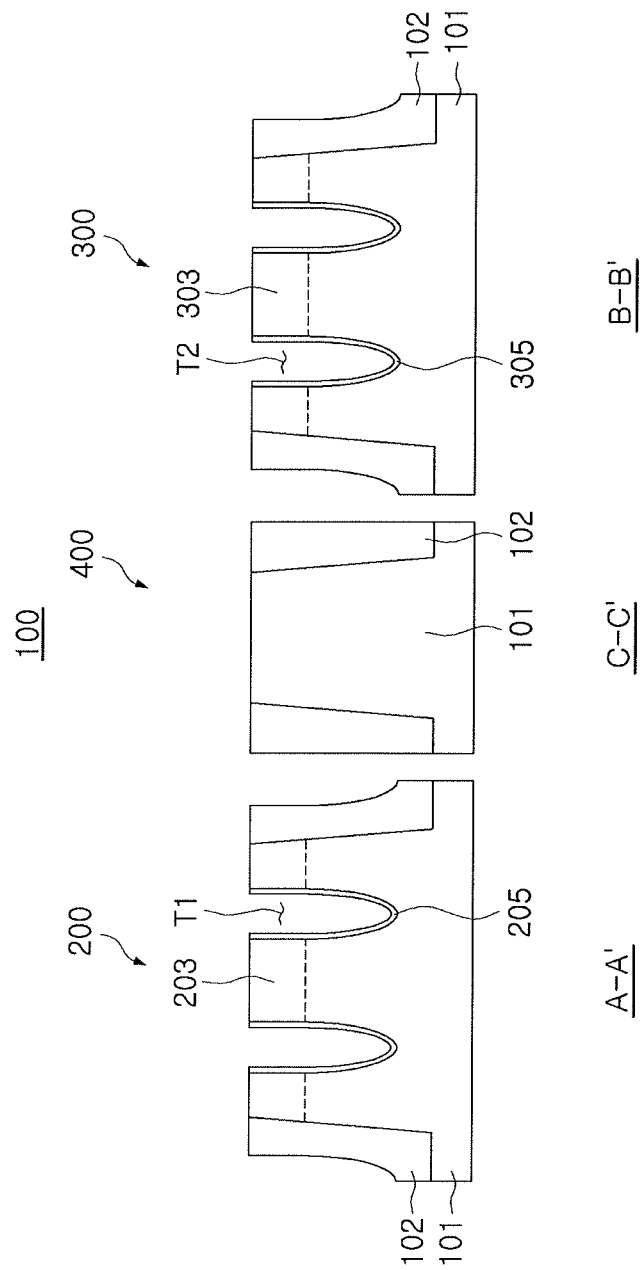

Referring to FIG. 10, after formation of the first gate insulating layer 205, the second gate insulating layer 305 may be formed in the second trenches T2. The second gate insulating layer 305 may be formed of an insulating material different from the material of the first gate insulating layer 205, and may be formed of, e.g., hafnium silicon oxide (HfSiO$_x$), hafnium zirconium oxide (HfZrO$_x$), hafnium aluminum oxide (HfAlO$_x$), or the like. The first gate insulating layer 205 and the second gate insulating layer 305 may be conformally formed along internal surfaces of the first trenches T1 and the second trenches T2. The first trenches T1 and the second trenches T2 may not be completely filled with the first gate insulating layer 205 and the second gate insulating layer 305.

In the example embodiment illustrated in FIGS. 9 and 10, the first gate insulating layer 205 is formed first, and then the second gate insulating layer 305 is formed. However, the order of formation thereof may be different. As an example, the second gate insulating layer 305 may be formed first, and then the first gate insulating layer 205 may be formed.

Figure 11:
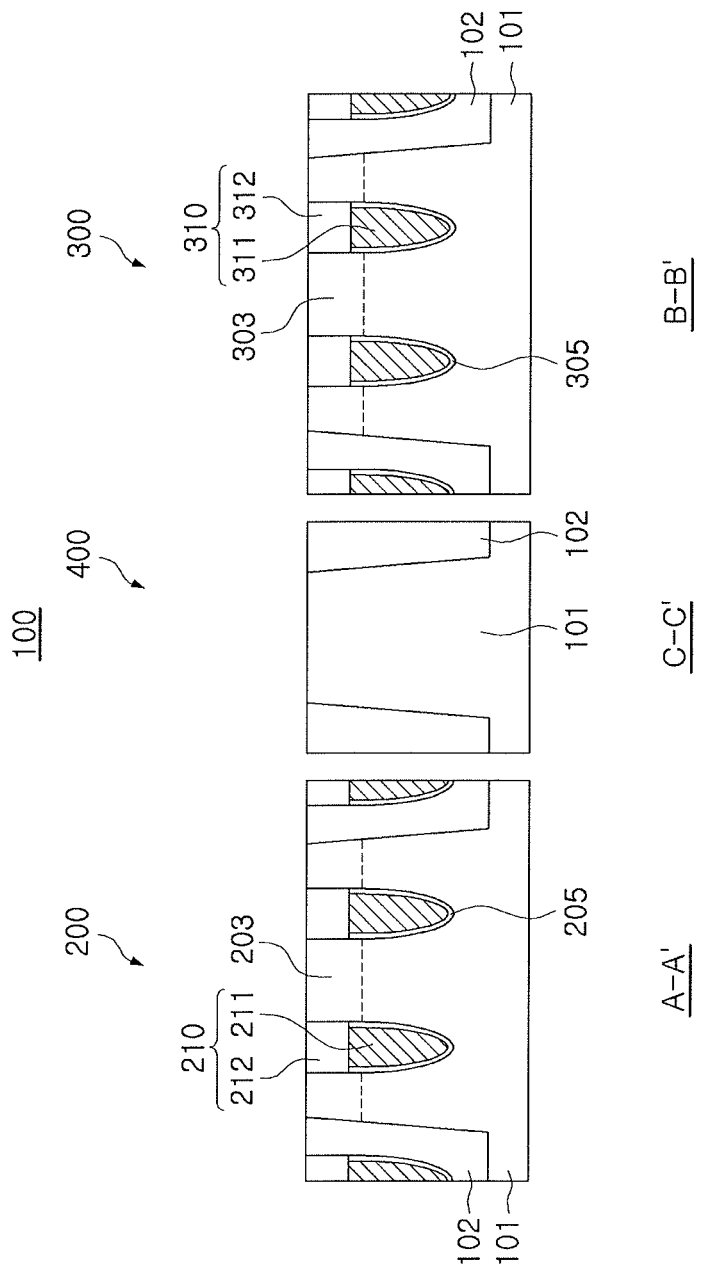

Referring to FIG. 11, the first gate structure 210 and the second gate structure 310 may be simultaneously formed in the first region 200 and the second region 300, respectively. The first trenches T1 and the second trenches T2, unfilled with the first gate insulating layer 205 and the second gate insulating layer 305, may be filled with a conductive material, e.g., tungsten (W), to form the first gate electrode layer 211 and the second gate electrode layer 311. That is, the first trenches T1 and the second trenches T2, which include therein respective conformal layers of the first gate insulating layer 205 and the second gate insulating layer 305, may be filled with a conductive material on the respective conformal layers of the first gate insulating layer 205 and the second gate insulating layer 305 to form the first gate electrode layer 211 and the second gate electrode layer 311, respectively. The first capping layer 212 and the second capping layer 312 may be formed, e.g., of a silicon nitride, or the like, on the first gate electrode layer 211 and the second gate electrode layer 311 to form a first gate structure 210 and a second gate structure 310, respectively.

As an example, the first gate insulating layer 205 and the second gate insulating layer 305 may be formed by filling portions of internal spaces of the first gate insulating layer 205 and the second gate insulating layer 305 with a conductive material, e.g., tungsten or the like. The first gate insulating layer 205 and the second gate insulating layer 305 on the first gate electrode layer 211 and the second gate electrode layer 311 may be removed by an etching process. A space, in which the first and second gate insulating layers 205 and 305 are removed, may be filled with, e.g., silicon nitride, or the like, to form the first capping layer 212 and the second capping layer 312.

Figure 12:
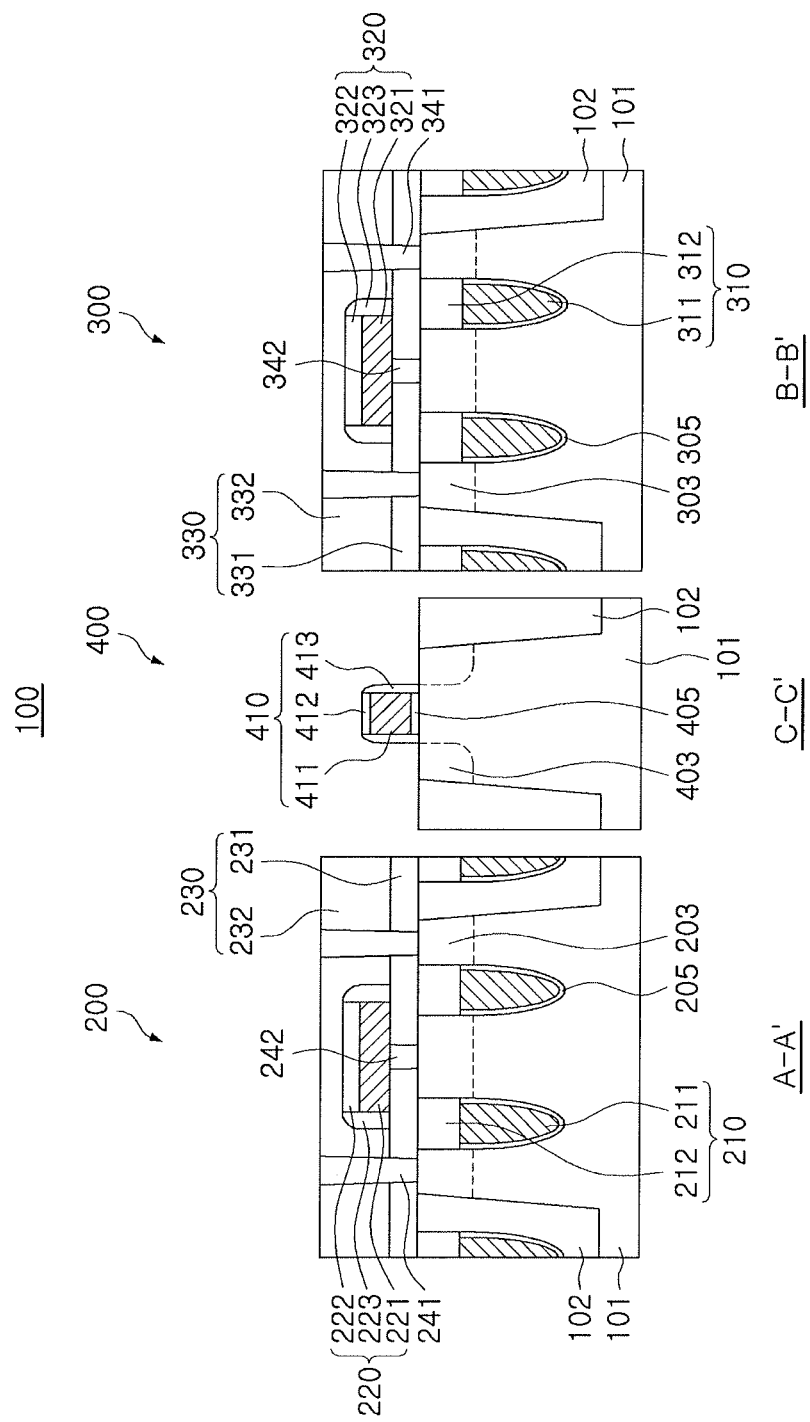

Referring to FIG. 12, the first bitline structure 220 and the second bitline structure 320 may be formed. The first insulating layers 231 and 331 may be formed on the substrate 101 in the first region 200 and the second region 300 before the first bitline structure 220 and the second bitline structure 320 are formed. Portions of the first insulating layers 231 and 331 may be etched on the first active region 203 and the second active region 303, and the etched portions may be filled with a conductive material to form the first contacts 241 and 341.

Whet the first contacts 241 and 341 are formed, the first bitline structure 220 and the second bitline structure 320 may be formed. The first bitline structure 220 may include the first bitline conductive layer 221, the first bitline capping layer 222, the first spacer layer 223, and the like, and may be embedded in the second insulating layer 232. The second bitline structure 320 may be formed simultaneously with the first bitline structure 220, and may have the same structure as the first bitline structure 220.

In an example embodiment, the transfer gate structure 410 of the third region 400 may be formed simultaneously with the first bitline structure 220 and the second bitline structure 320. The transfer gate structure 410 may include a transfer gate electrode layer 411, a transfer gate capping layer 412, a spacer layer 413, and the like. A transfer gate insulating layer 405 may be formed between the transfer gate structure 410 and the substrate 101. After the transfer gate structure 410 is formed, an impurity implantation process may be performed on the third region 400 to form he active region of the transfer switch on opposite sides adjacent to the transfer gate structure 410.

Figure 13:
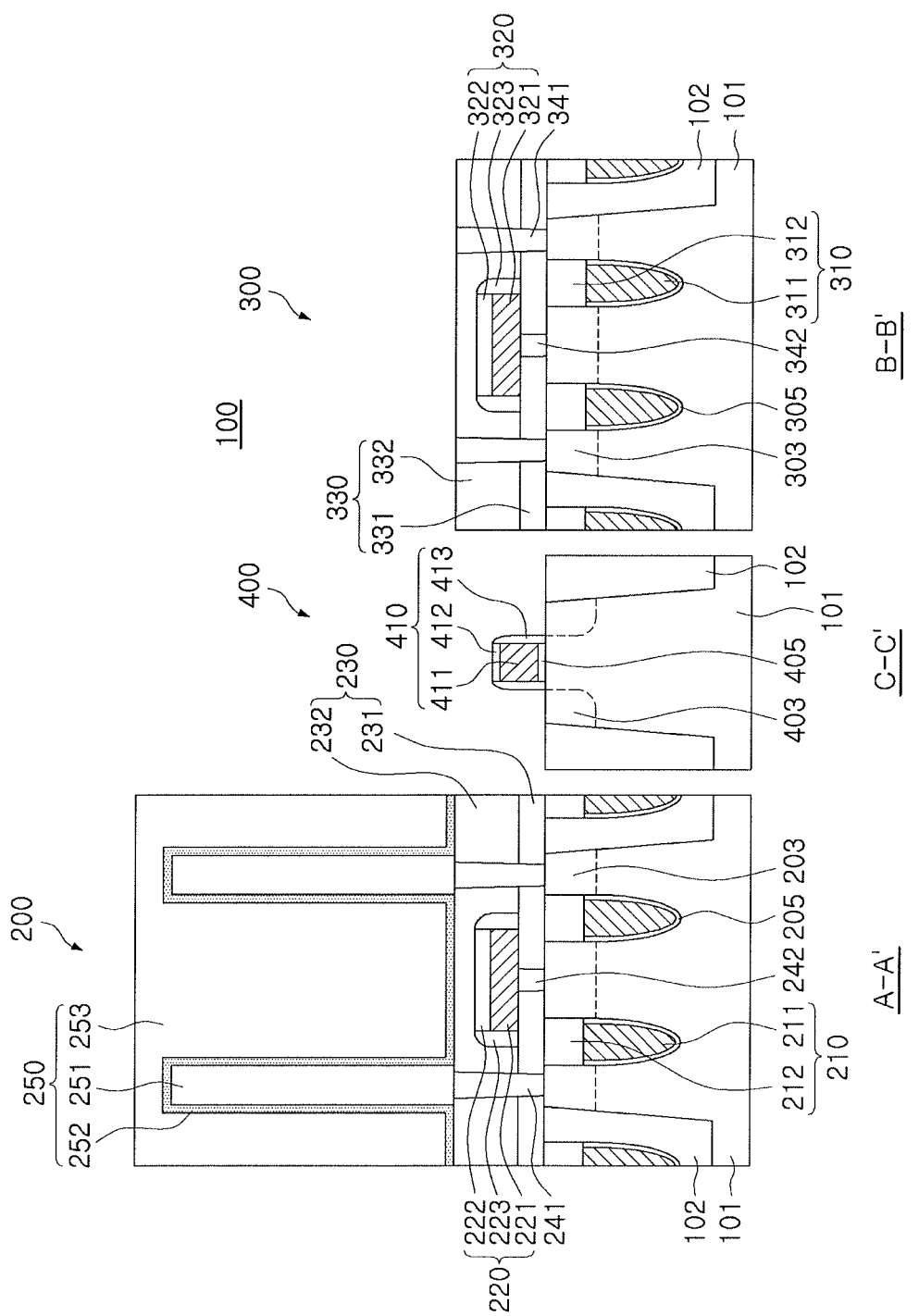

Referring to FIG. 13, the capacitor structure 250 may be formed in the first region 200. The capacitor structure 250 may include the lower electrode layer 251, the dielectric layer 252, the upper electrode layer 253, and the like. In an example embodiment, a capacitor may not be formed in the second region 300, and thus, the second memory cells may have a capacitorless structure. In the capacitor structure 250, the lower electrode layer 251 may have a hollow cylinder structure, as illustrated in FIG. 13. In this case, the dielectric layer 252 and the upper electrode layer 253 may also be formed in the internal space of the lower electrode layer 251 having the cylinder structure.

The first gate structure 210 and the second gate structure 310 may be connected to the active region 403, formed in the third region 400, by process subsequent to the step illustrated in FIG. 13. Accordingly, when the transfer switches are turned on by a voltage input to the transfer gate structure 410, the first gate structure 210 and the second gate structure 310 may be connected to each other, and first wordlines of the first region 200 and second wordlines of the second region 300 may be connected to each other. The memory device 100 may turn the plurality of transfer switches on and may transfer data, stored in the first memory cells, to the second memory cells and store the transferred data in the second memory cells, or may bring data of the second memory cells and store the data in the first memory cells.

Figure 14:
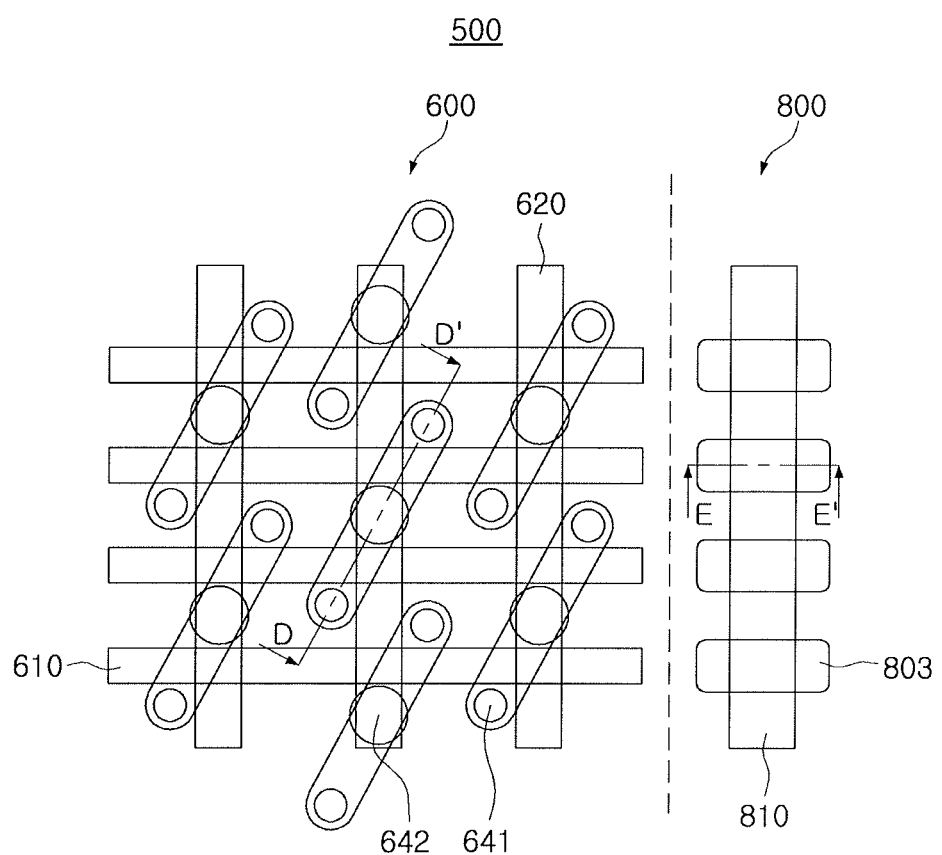
FIGS. 14 and 15 illustrate schematic top views of a memory cell array of a memory device according to an example embodiment.
Figure 15:
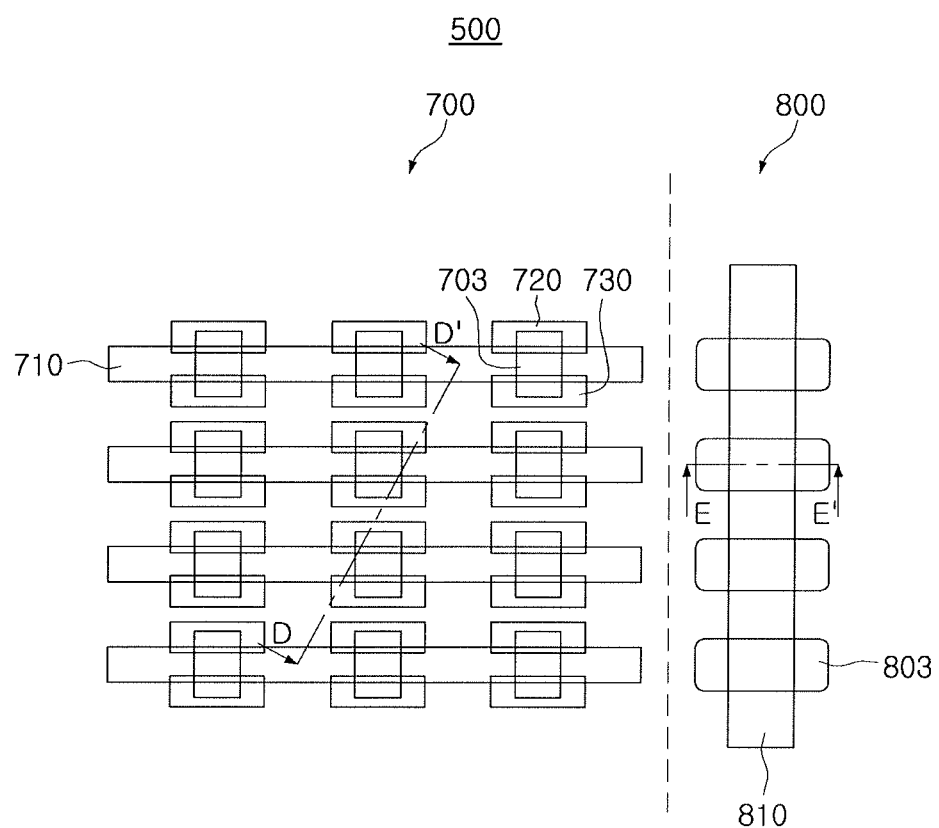
Figure 16:
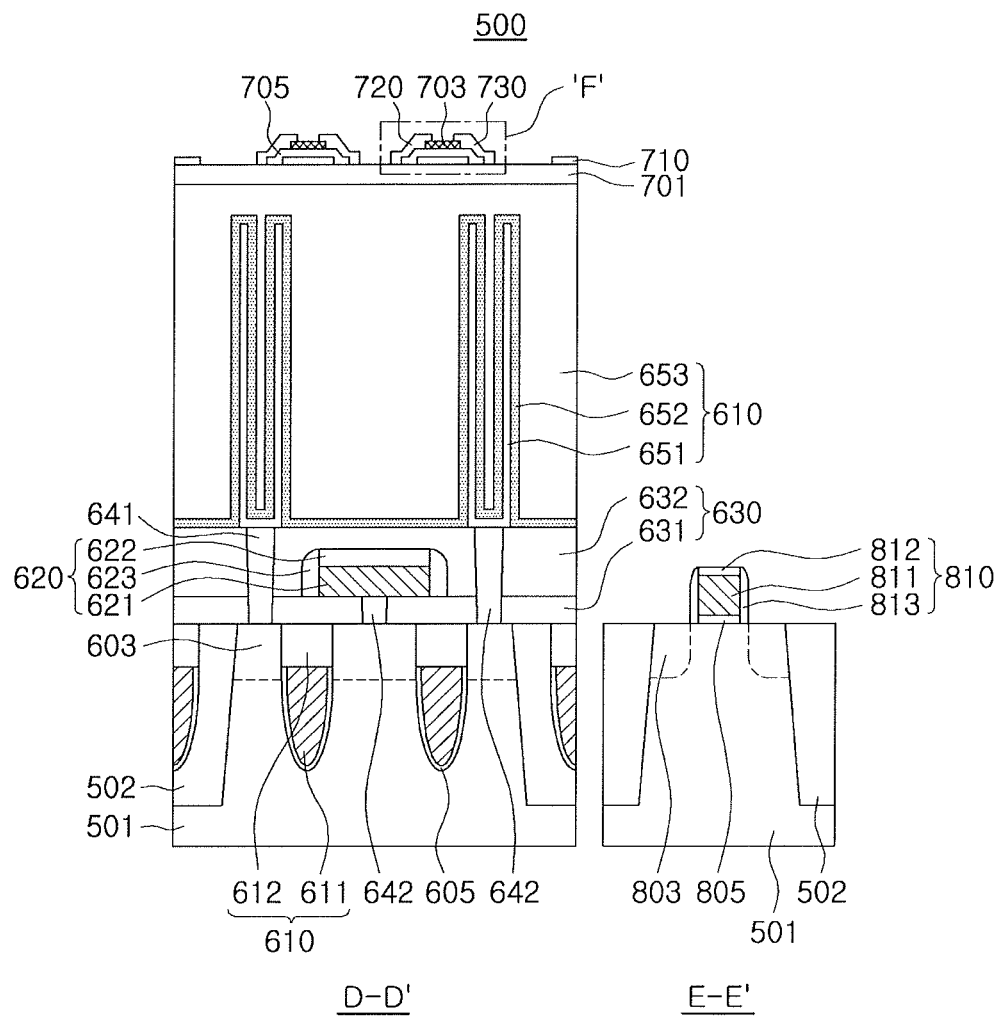
FIG. 16 illustrates a cross-sectional view taken along lines D-D' and E-E' of the memory cell array in FIG. 15.

FIGS. 14 and 15 are schematic top views of a memory cell array of a memory device according to an example embodiment, and FIG. 16 is a cross-sectional view taken along lines D-D' and E-E' of the memory cell array illustrated in FIG. 15.

In the example embodiment illustrated in FIGS. 14 to 16, a memory device 500 may include a first region 600, a second region 700, and a third region 800. The first region 600 and the second region 700 may be regions stacked on each other in a direction perpendicular to a top surface of a substrate 501. First memory cells having volatility are formed in the first region 600, and second memory cells having non-volatility may be formed in the second region 700. The third region 800 may be a region adjacent to the first region 600 and the second region 700 in a direction parallel to the top surface of the substrate 501, and may be a region in which transfer switches are formed in a region.

Referring first to FIGS. 14 and 16, a first active region 603 defined between isolation layers 502, a first gate structure 610 providing a first wordline, a first bitline structure 620 connected to at least a portion of the first active region 603, and a capacitor structure 650, and the like, may be formed in the first region 600. The first gate structure 610 may intersect the first active region 603 and the first bitline structure 620 and may be embedded in the substrate 501.

The first gate structure 610 may include a first gate electrode layer 611 formed, e.g., of a conductive material, and a first capping layer 612 formed of an insulating material, e.g., silicon nitride, and the like. A first gate insulating layer 605, formed, e.g., of a silicon oxide or the like, may be disposed between the first gate electrode layer 611 and the substrate 501. The first active region 603 may be doped with impurities and may provide a source region and a drain region of a cell switch included in a first memory cell. The first active region 603, disposed between the first gate structure 610 and the device isolation layer 502, may be connected to a capacitor structure 650 through a first contact 641. The first active region 603 between a pair of first gate structures 610 adjacent to each other may be connected to a first bitline structure 620 through a second contact 642.

The first bitline structure 620 may be embedded in an intermediate insulating layer 630 together with the first contact 641 and the second contact 642. The intermediate insulating layer 630 may include a first intermediate insulating layer 631 and a second intermediate insulating layer 632. The first bitline structure 620 may include a first bitline conductive layer 621, a first bitline capping layer 622, a first spacer layer 623, and the like. The first bitline structure 620 may intersect the first gate structure 610. For example, the first bitline structure 620 may vertically intersect the first gate structure 610 in a direction parallel to the top surface of the substrate 501.

The capacitor structure 650 may be connected to the first active region 603 through the first contact 641 and may include a lower electrode layer 651, a dielectric layer 652, and an upper electrode layer 653. The lower electrode layer 651 may have a hollow pillar shape, and the dielectric layer 652 may be conformally formed along a surface of the lower electrode layer 651. The upper electrode layer 653 may be formed on the dielectric layer 652.

The second region 700 may be a region disposed above the first region 600, and may include second memory cells having non-volatility. Referring to FIG. 16, the second region 700 includes an isolation insulating layer 701 formed on the upper electrode layer 653, and the second memory cells may be formed on the isolation insulating layer 701. The second region 700 may include a second gate structure 710 extending in the same direction as the first gate structure 610, a second gate insulating layer 705 on the second gate structure 710, second active region 703, 720, and 730 on the gate insulating layer 705, and the like. The second active regions 703, 720, and 730 may include a channel region 703, a source region 720, a drain region 730, and the like. The second gate structure 710 may provide a second wordline of the second region 700.

As an example, the second memory cell may not include a capacitor, and thus, may have a size smaller than a size of the first memory cell. In addition, the second memory cells may be stacked on the first memory cells to integrate the first memory cells and the second memory cells into a single memory device 500 without increasing an area occupied by the memory cells. A detailed structure of the second memory cell will be described later with reference to FIG. 17.

The third region 800 may be a region in which transfer switches are formed. An active region 803 between the device isolation layers 502, a transfer gate structure 810, and the like, may be formed in the third region 800. The transfer gate structure 810 may include a transfer gate electrode layer 811, a transfer gate capping layer 812, a spacer layer 813, and the like. A transfer gate insulating layer 805 may be disposed between the transfer gate electrode layer 811 and the substrate 501. The transfer gate insulating layer 805 may be formed of a silicon oxide, or the like.

The active region 803 on one side adjacent to the transfer gate structure 810 may be connected to the first gate structure 610 formed in the first region 600. The active region 803 on the other side adjacent to the transfer gate structure 810 may be formed of a conductive material and may be connected to the second gate structure 710, formed in the second region 700, by a contact structure perpendicular to the top surface of the substrate 501, or the like. Accordingly, the first gate structure 610 may be connected to the second gate structure 710 according to a voltage input to the transfer gates structure 810, and the first wordlines of the first region 600 may be connected to the second wordlines of the second region 700.

Figure 17:
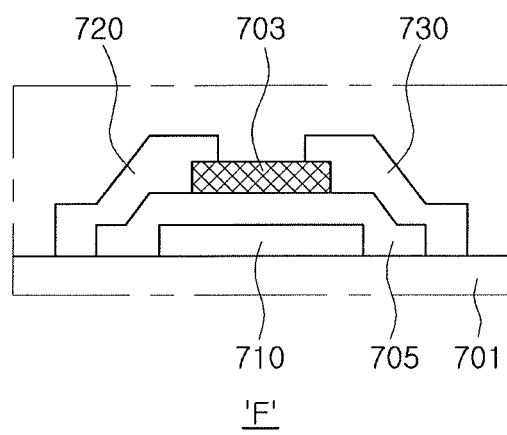
FIG. 17 illustrates an enlarged view of region F of the memory cell array in FIGS. 14 and 15.

FIG. 17 is an enlarged view of region F of the memory cell array illustrated in FIG. 16.

The second gate structure 710 may be formed of a conductive material. As an example, the second gate structure 710 may be formed in the same location as the first gate structure 610. As illustrated in FIG. 16, the first gate structure 610 and the second gate structure 710 may overlap each other on a plane parallel to the top surface of the substrate 501.

A second gate insulating layer 705 may be formed between the second gate structure 710 and the channel region 703. The second gate insulating layer 705 may be formed of a ferroelectric material, e.g., hafnium silicon oxide (HfSiO$_x$), hafnium zirconium oxide (HfZrO$_x$), hafnium aluminum oxide (HfAlO$_x$), or the like. A channel region 703 may be formed of indium-gallium-zinc oxide (IGZO). A source region 720 and a drain region 730 may be formed of a conductive material on the channel region 703 and the second gate insulating layer 705.

Figure 18:
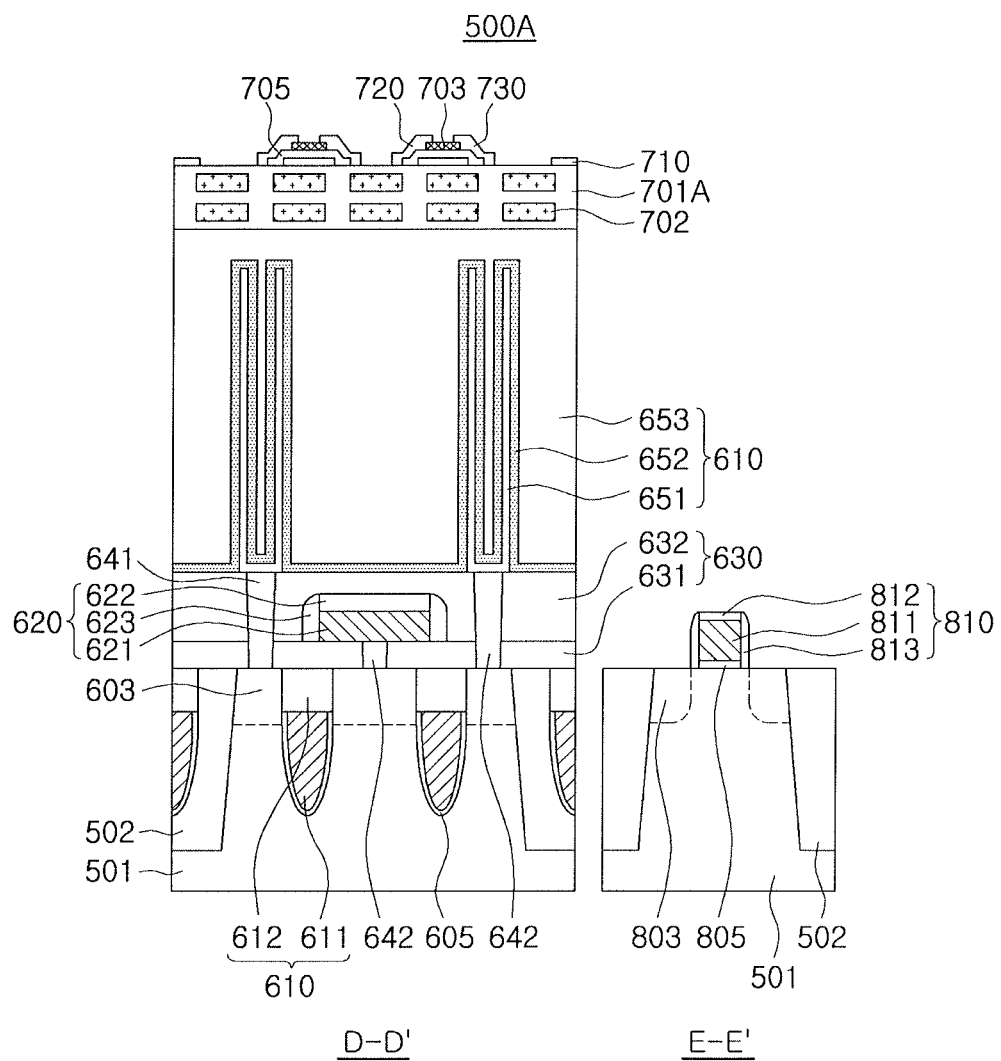
FIG. 18 illustrates a cross-sectional view taken along lines D-D' and E-E' of the memory cell array in FIGS. 14 and 15.

FIG. 18 is a cross-sectional view taken along lines D-D' and E-E' of the memory cell array illustrated in FIGS. 14 and 15.

Referring to FIG. 18, a first region 600 and a third region 800, included in a memory device 500A, are similar to those described above with reference to FIGS. 14 to 16. However, in the example embodiment illustrated in FIG. 18, metal interconnections 702 may be formed in the isolation insulating layer 701 of a second region 700A. The metal interconnections 702 may be interconnections connected to components formed in at least one of the first region 600, the second region 700A, and a third region 800.

Unlike the example embodiment illustrated in FIG. 18, second memory cells, included in the second region 700A, may be disposed at the same height as the metal interconnections 702. In this case, the second memory cells and the metal interconnections 702 may be embedded together in an upper insulating layer 701A, and the metal interconnections 702 may be disposed between the second memory cells.

Figure 19:
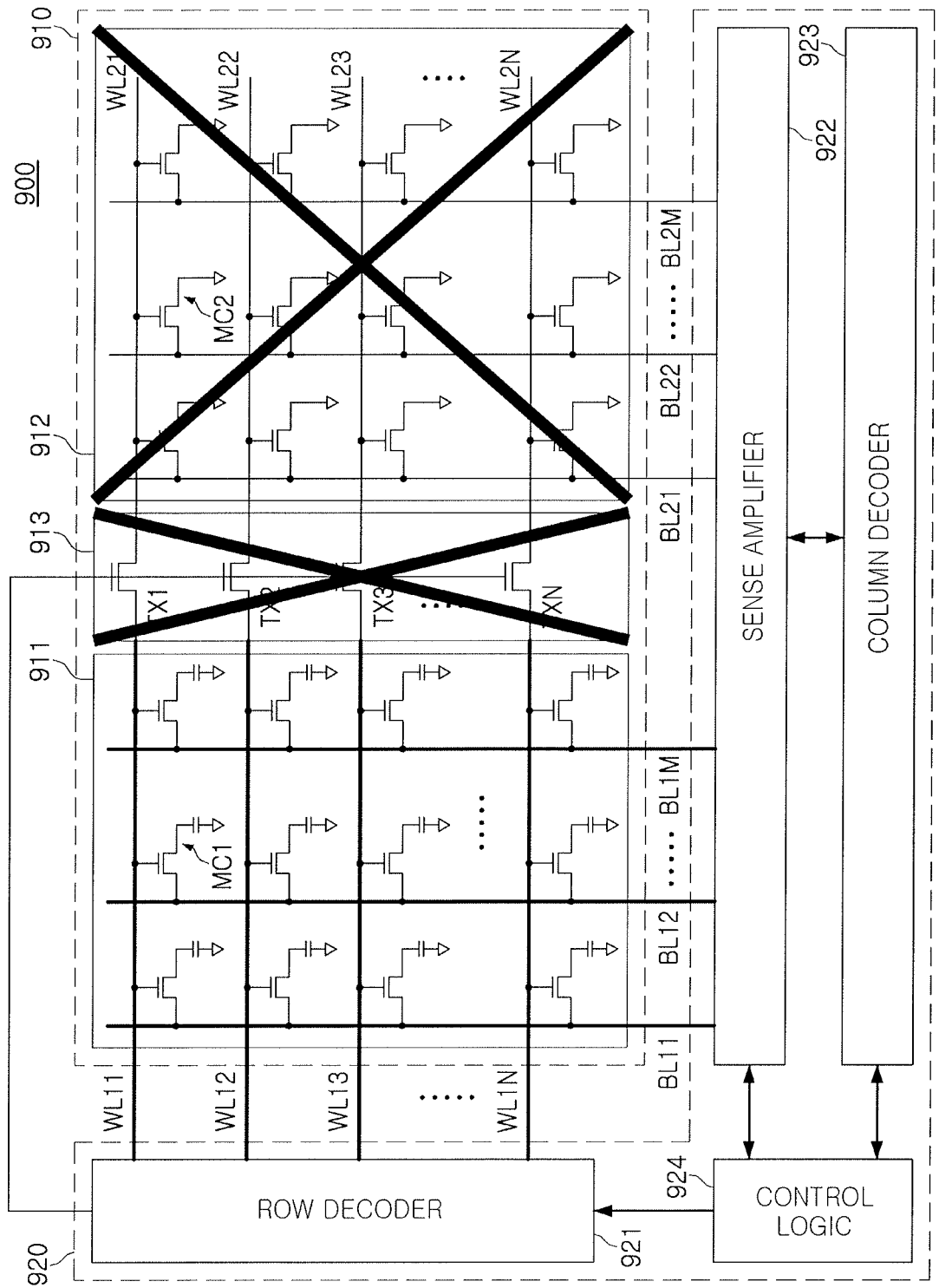
FIGS. 19 and 20 illustrate an operation of a memory device according to an example embodiment.
Figure 20:
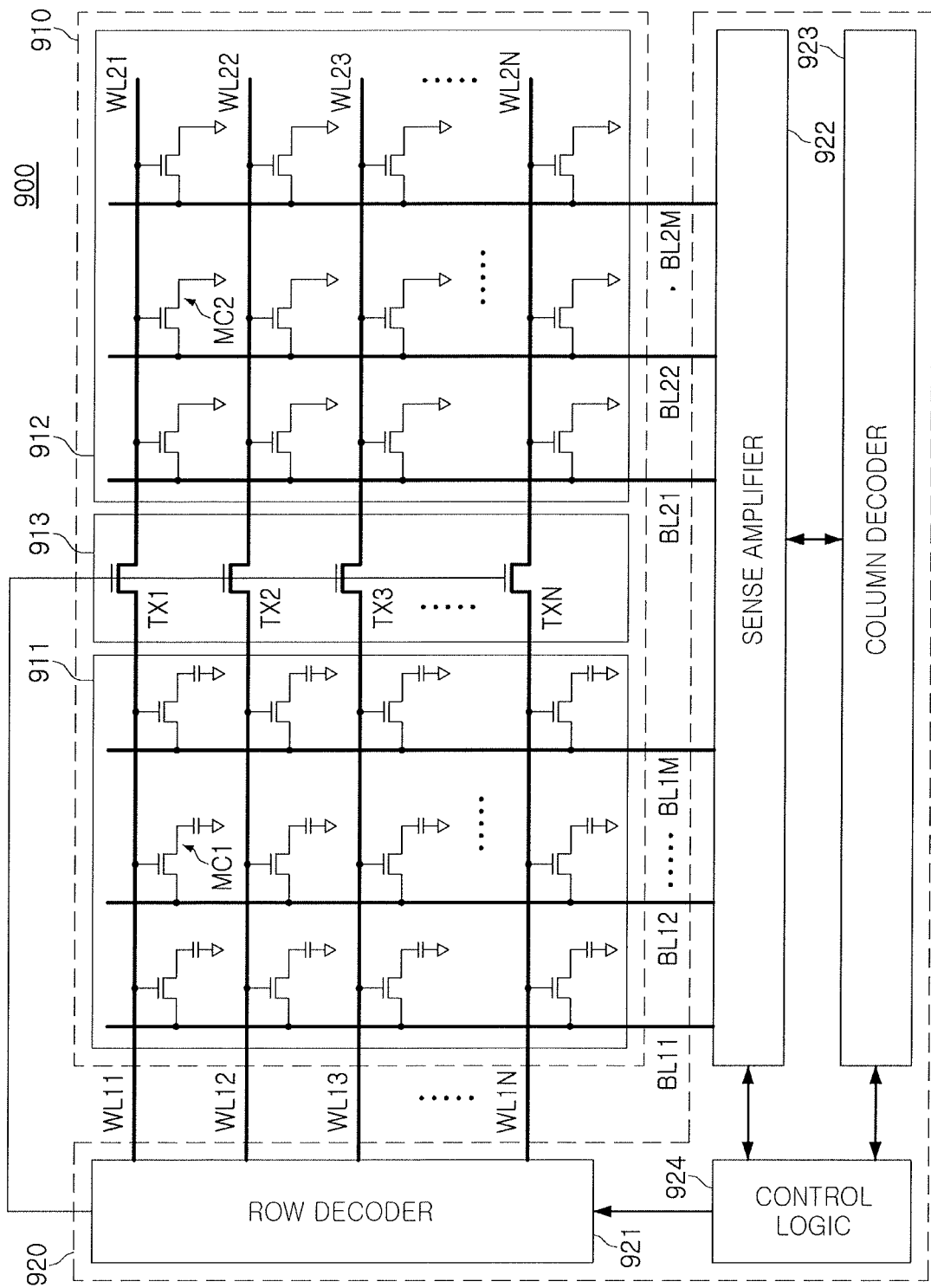

FIGS. 19 and 20 illustrate an operation of a memory device according to an example embodiment A memory device 900 according to an example embodiment illustrated in FIGS. 19 and 20 may include a memory cell array 910 and a controller 920. The memory cell array 910 may include a first memory cell array 911, a second memory cell array 912, and a transfer switch array 913. The controller 920 may include a row decoder 921, a sense amplifier 922, a column decoder 923, a control logic 924, and the like.

The first memory cell array 911 may include first memory cells MC1, and the second memory cell array 912 may include second memory cells MC2. The transfer switch array 913 may include transfer switches TX1 to TXN. The first memory cells MC1 are connected to the first wordlines WL11 to WL1N, and first bitlines BL11 to BL1M and second memory cells MC2 are connected to second wordlines WL21 to WL2N and second bitlines BL21 to BL2M. The transfer switches TX1 to TXN may be connected between the first wordlines WL11 to WL1N and the second wordlines WL21 to WL2N. Gates of the transfer switches TX1 to TXN may be connected to each other, and the transfer switches TX1 to TXN may be turned on or off by the row decoder 921.

The row decoder 921 may be connected to the first memory cell array 911 through the first wordlines WL11 to WL1N. The sense amplifier 922 may be connected to the first memory cells MC1 and the second memory cells MC2 through the first bitlines BL11 to BL1M and the second bitlines BL21 to BL2M. The column decoder 923 transfers data, read from the first memory cells MC1 and the second memory cells MC2, to the control logic 924 or may input data, transferred by the control logic 924, to the sense amplifier 922.

The memory device 900 according to an example embodiment may operate in a first mode and a second mode different from the first mode. Hereinafter, the operation in the first mode will be described with reference to FIG. 19, and the operation in the second mode will be described with reference to FIG. 20.

Referring to FIG. 19, the transfer switches TX1 to TXN may be turned off in the first mode. Accordingly, the first wordlines WL11 to WL1N and the second wordlines WL21 to WL2N are separated from each other, and the controller 920 may not control the second memory cell array 912. For example, the second memory cell array 912 may be deactivated in the first mode.

In the first mode, the memory device 900 may write data into the first memory cell array 911 or may read data from the first memory cell array 911. The row decoder 921 may select at least one of the first wordlines WL11 to WL1N, depending on address information received from the control logic 924. The sense amplifiers BL11 to BL1M may perform a programming operation for storing data or a reading operation for reading data on the first memory cells MC1 connected to a wordline, selected by the row decoder 921, among the first wordlines WL11 to WL1N.

As an example, the memory device 900 may operate as a main memory of a computer device. The first mode may be a mode in which a programming operation and a reading operation are continuously performed in the memory device 900. In the first mode, the memory device 900 may turn off the transfer switches TX1 to TXN to deactivate the second memory cell array 912 and may perform a programming operation and a reading operation using the first memory cell array 911 having higher operating speed than the second memory cell array 912.

Referring to FIG. 20, the transfer switches TX1 to TXN may be turned on in the second mode. Accordingly, the first wordlines WL11 to WL1N and the second wordlines WL21 to WL2N may be connected to each other by transfer switches TX1 to TXN, and the controller 920 may control the second memory cell array 912. For example, the second memory cell array 912 may be activated in the second mode.

In an example embodiment, in the second mode, the memory device 900 may read data stored in the first memory cell array 911 and may store the read data in the second memory cell array 912. As an example, the second mode may be an idle state in which change of data, stored in the first memory cell array 911, does not occur. In the idle state, a significant portion of power consumption of the memory device 900 may be consumed by a refresh operation of retaining data stored in the first memory cells MC1.

In an example embodiment, in the second mode corresponding to the idle state, data stored in the first memory cells MC1 may be stored in the second memory cells MC2. Referring to FIG. 20, the transfer switches TX1 to TXN may be turned on, and the sense amplifier 922 may read data from the first memory cells MC1 through the first bitlines BL11 to BL1M. The sense amplifier 922 may store the data, read from the first memory cells MC1, in the second memory cells MC2 through the second bitlines BL21 to BL2M.

Unlike the first memory cells MC1, the second memory cells MC2 may have non-volatility. Data of the first memory cells MC1 may be transferred to the second memory cells MC2 and stored therein to reduce or omit the refresh operation in the idle state and to reduce power consumption of the memory device 900. When the memory device 900 enters the first mode from the second mode, the controller 920 may read data of the second memory cells MC2 and store the read data in the first memory cells MC1, and may turn off the transfer switches TX1 to TXN.

The operation of transferring the data of the first memory cells MC1 to the second memory cells MC2 and storing the transferred data in the second memory cells MC2 may be performed in every predetermined period. For example, the controller 920 may operate in the second mode in every predetermined period to store data of the first memory cells MC1 in the second memory cells MC2. Storage capacity of the second memory cell array 912 may be higher than or equal to storage capacity of the first memory cell array 911 such that data of the first memory cells MC1 may be transferred the second memory cells MC2 and stored in the second memory cells MC2.

Figure 21:
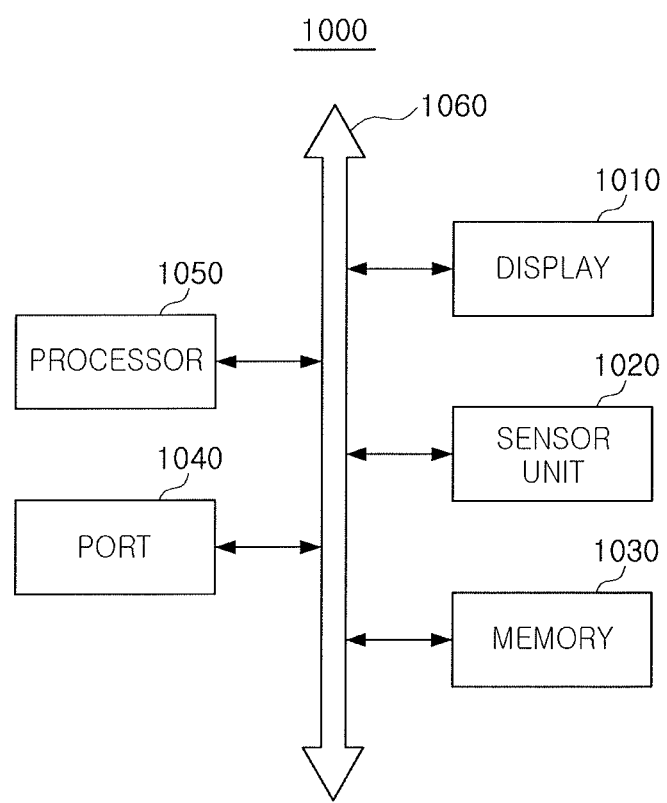
FIG. 21 illustrates a schematic block diagram of an electronic device including a memory device according to an example embodiment.

FIG. 21 is a schematic block diagram of an electronic device including a memory device according to an example embodiment.

An electronic device 1000 according to an example embodiment illustrated in FIG. 21 may include a display 1010, a sensor unit 1020, a memory 1030, a processor 1040, an input/output (I/O) unit 1050, and the like. Components such as the display 1010, the sensor unit 1020, the memory 1030, the processor 1040, the I/O unit 1050, and the like, may communicate with each other through a bus 1060.

Beside the illustrated components, the electronic device 1000 may further include a power supply, a port, and the like.

The processor 1040 may execute a specific operation, a command, a task, and the like. The processor 1040 may be a central processing unit (CPU), a microprocessor unit (MCU), an application processor (AP), or the like, and may communicate with other components such as the display 1010, sensor unit 1020, memory 1030, the I/O unit, and the like.

The memory 1030, included in the electronic device 1000 illustrated in FIG. 21, may include a memory device according to various embodiments. As an example, the memory 1030 may include a memory device according to one of the example embodiments described with reference to FIGS. 1 to 20, as main memory. The memory 1030 may store, output, or erase data in response to a command transmitted from the processor 1040. The memory 1030 may transfer data of volatile memory cells to nonvolatile memory cells and store the transferred data in the nonvolatile memory cells in an idle state, in which a programming operation and a reading operation is performed by the processor 1040, to reduce power consumed in a refresh operation. Alternatively, the memory 1030 may transfer data of volatile memory cells to nonvolatile memory cells and store the transferred data in the nonvolatile memory cells in every predetermined period.

As described above, according to example embodiments, a memory device may include first memory cells having volatility and second memory cells having non-volatility, and may store data of the first memory cells in the second memory cells to significantly reduce a refresh operation. The memory device may mainly use the first memory cells having volatility to secure high operating speed and may back up the data of the first memory cells to the second memory cells having non-volatility to significantly reduce power consumption caused by the refresh operation. For example, a DRAM memory cell and an FeRAM memory cell having non-volatility have a transfer switch connected therebetween, so data of the DRAM memory cell may be retained by turning on the transfer switch and storing data of the DRAM memory cell in the FeRAM memory cell. As a result, a memory device having improved operating speed and reduced power consumption may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a first memory cell array including first memory cells having volatility;
   a second memory cell array including second memory cells having non-volatility, each of the second memory cells having a height smaller than a height of each of the first memory cells in a direction perpendicular to a top surface of a substrate in which the first memory cells and the second memory cells are disposed;
   transfer switches between the first memory cells and the second memory cells; and
   a controller configured to turn on the transfer switches, read data of at least one of the first memory cells, and store the data in at least one of the second memory cells.

2. A method of manufacturing a memory device, the method comprising:
   forming isolation layers in a first region and a second region of a substrate to define first and second active regions in the first and second regions, respectively;
   removing at least a portion of the first active regions and at least a portion of the second active regions to form trenches;
   forming first gate insulating layers in the trenches of the first active regions;
   forming second gate insulating layers in the trenches of the second active regions, a material of the second gate insulating layers being different from a material of the first gate insulating layers;
   forming gate structures in the trenches of the first and second active regions, such that a first memory cell array with first memory cells having volatility is formed in the first active region and a second memory cell array with second memory cells having non-volatility is formed in the second active region, each of the second memory cells having a height smaller than a height of each of the first memory cells in a direction perpendicular to a top surface of the substrate;
   forming transfer switches between the first memory cells and the second memory cells; and
   forming a controller configured to turn on the transfer switches, read data of at least one of the first memory cells, and store the data in at least one of the second memory cells.

3. The method as claimed in claim 2, wherein a dielectric constant of the second gate insulating layers is higher than a dielectric constant of the first gate insulating layers.

4. The method as claimed in claim 2, further comprising forming capacitors connected to the first active regions.

5. The method as claimed in claim 2, wherein forming the transfer switches includes forming the transfer switches in a third region between the first region and the second region, each of the transfer switches including a third active region and a third gate structure, the third active region being connected to the gate structures of the first region and the second region.

6. A method of manufacturing a memory device, the method comprising:
   forming a first gate structure embedded in a substrate, a first active region including a first channel region adjacent to the first gate structure, and a capacitor connected to the first active region and extended in a direction perpendicular to a top surface of the substrate, such that a first memory cell having volatility is formed in the first active region;
   forming an interlayer insulating layer to cover the capacitor;
   forming a second gate structure on the interlayer insulating layer;
   forming a ferroelectric layer to cover the second gate structure; and
   forming a second channel region, including an indium-gallium-zinc oxide, and a second active region, connected to the second channel region, on the ferroelectric layer, such that a second memory cell having non-volatility is formed in the second active region, the second memory cell having a height smaller than a height of the first memory cell in a direction perpendicular to a top surface of the substrate;

forming a transfer switch between the first and second memory cells; and forming a controller configured to turn on the transfer switch, read data of the first memory cell, and store the data in the second memory cell.

7. The memory device as claimed in claim 1, wherein the second memory cells are at a same height as the transfer switches.

8. The memory device as claimed in claim 7, wherein the first memory cells extend above the second memory cells.

9. The memory device as claimed in claim 1, wherein:

each of the first memory cells includes a capacitor connected to a corresponding one of the transfer switches, the capacitor extending in the direction perpendicular to the top surface of the substrate, and each of the second memory cells does not include a capacitor.

10. The memory device as claimed in claim 1, wherein the transfer switches share a single transfer gate structure.

* * * * *